(12) United States Patent
Ginetti et al.

(10) Patent No.: US 10,565,342 B1
(45) Date of Patent: Feb. 18, 2020

(54) ELECTRONIC CIRCUIT DESIGN EDITOR WITH OVERLAY OF LAYOUT AND SCHEMATIC DESIGN FEATURES

(71) Applicant: CADENCE DESIGN SYSTEMS, INC., San Jose, CA (US)

(72) Inventors: Arnold Ginetti, Antibes (FR); Sunil Prasad Todi, Noida (IN); Hitesh Marwah, Noida (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 89 days.

(21) Appl. No.: 15/883,470

(22) Filed: Jan. 30, 2018

(51) Int. Cl.
*G06F 17/50* (2006.01)

(52) U.S. Cl.
CPC ........ *G06F 17/5072* (2013.01); *G06F 17/505* (2013.01); *G06F 17/5081* (2013.01)

(58) Field of Classification Search
CPC . G06F 17/505; G06F 17/5081; G06F 17/5072
USPC .......................................... 716/110, 118, 119
See application file for complete search history.

(56) References Cited

U.S. PATENT DOCUMENTS

| | | | | |
|---|---|---|---|---|
| 5,581,475 A * | 12/1996 | Majors | ................ | G06F 17/5081 716/112 |
| 5,787,268 A * | 7/1998 | Sugiyama et al. | .......................... | G06F 17/5022 714/735 |
| 6,253,351 B1 * | 6/2001 | Fukui | ................... | G06F 17/505 716/107 |
| 6,324,675 B1 * | 11/2001 | Dutta et al. | ......... | G06F 17/5077 716/130 |
| 6,711,730 B2 * | 3/2004 | Frank et al. | ........ | G06F 17/5068 716/113 |
| 7,275,227 B1 * | 9/2007 | Ying | ........................ | G03F 1/36 716/52 |
| 7,315,990 B2 * | 1/2008 | Archambeault et al. | .................... | G06F 17/5081 716/112 |
| 7,886,238 B1 * | 2/2011 | Sharma et al. | ..... | G06F 17/5068 716/132 |
| 8,271,909 B2 * | 9/2012 | Majunnder et al. | ........................ | G06F 17/5081 716/104 |
| 9,026,958 B1 * | 5/2015 | Ghosh et al. | ....... | G03F 7/70466 716/139 |

(Continued)

*Primary Examiner* — Sun J Lin
(74) *Attorney, Agent, or Firm* — Tarolli, Sundheim, Covell & Tummino LLP

(57) ABSTRACT

A system and method for an interactive circuit layout design that provides spatially adaptive overlay indicative of parametric properties. A physical layout of an electrical circuit product is rendered on a display. At least one net of the physical layout is delineated into a plurality of net segments each having at least one physical property parametrically specified in a value therefor. For each net segment, a corresponding segment indicator is selectively rendered on the display, adaptively positioned and spatially mapped to the net segment corresponding thereto as a symbolic surrogate for the corresponding net segment within the physical layout. Selection of a net segment actuates determination of a behavior of the electrical circuit product during an operation consistent with an electrical response of the corresponding net segment. Editing of a net of the physical layout delineates a plurality of updated net segments for the edited net exclusive of other nets.

20 Claims, 16 Drawing Sheets

(56) References Cited

U.S. PATENT DOCUMENTS 10,002,224 B2* 6/2018 McComber et al. ........................ G06F 17/5077
2018/0011958 A1* 1/2018 Irissou et al. ....... G06F 17/5036

* cited by examiner

ELECTRONIC CIRCUIT DESIGN EDITOR WITH OVERLAY OF LAYOUT AND SCHEMATIC DESIGN FEATURES

BACKGROUND OF THE INVENTION

The subject system and method are generally directed to viewing, editing, and simulating a circuit design on a circuit design editor. The system and method generally provide for a division of layout-based interaction and schematic-based interaction, overlaying indicators upon corresponding layout elements to serve as surrogates for the layout elements when determining or editing schematic features thereof.

Modern electrical circuits and circuit boards are both highly complex and highly precise. Robust circuit design editors have therefore become increasingly important to the design process. Such editors allow a circuit designer or design team to arrange and rearrange various circuit components or elements and the interconnections therebetween, for later manufacture of the resulting circuit design. Many editors also enable simulation of a circuit's behavior, to test it for flaws in power, timing, or other important features, which assists the circuit designer in making any necessary adjustments. Additional benefits in many editors include automated measures for monitoring the design to confirm that its elements suitably comply with predetermined criteria. The circuit product can thereby be improved and brought into compliance with the criteria before time and expense is spent on manufacturing a physical circuit in accordance with the designed layout.

However, even a design tool can be expensive to operate for sufficiently complicated circuitry, in the time and computer memory required to run simulations and intelligibly present all features of the circuit, as well as in the computer storage space required for the data representing the circuit and the results of the simulation. It is therefore an ongoing effort in the field to develop more efficient processes for any and all of the above circuit editing features.

SUMMARY OF THE INVENTION

It is an object of the disclosed system and method to determine the effects of particular changes to a circuit design by reprocessing an incremental portion of the design, rather than the entire design.

It is another object of the disclosed system and method to accurately and efficiently determine both layout and schematic features of nets in a circuit design without.

It is yet another object of the disclosed system and method to intuitively present both layout and schematic features of a circuit design in a single interface for ease of viewing and editing.

These and other objects may be attained in an electronic circuit design editor with overlay of layout and schematic design features. In accordance with certain embodiments of the present invention, a system is provided for interactive circuit layout design having spatially adaptive overlay indicative of parametric properties thereof. The system includes a layout rendering portion executable to graphically render on a display a physical layout of an electrical circuit product to be manufactured, where the physical layout includes a plurality of nets routed to interconnect electronic components of the electrical circuit. The system also includes a net analyzing portion coupled to said layout rendering portion, where the net analyzing portion is executable to delineate a plurality of net segments for at least one of the nets of the physical layout, and each of the net segments have at least one physical property parametrically specified in value therefor. The system also includes an overlay rendering portion coupled to said net analyzing portion, where the overlay rendering portion is executable to selectively render on the display a plurality of segment indicators respectively corresponding to the net segments, and each of the segment indicators is adaptively positioned on the display spatially mapped to the net segment corresponding thereto as a symbolic surrogate for the corresponding net segment within the physical layout. The net analyzing portion executes upon selection of a segment indicator to determine a behavior of the electrical circuit product during operation consistent with electrical response of the corresponding net segment in accordance with the specified physical property thereof.

In accordance with other embodiments of the present invention, a method is provided for interactive circuit layout design having spatially adaptive overlay indicative of parametric properties thereof. The method includes graphically rendering on a display a physical layout of an electrical circuit product to be manufactured, where the physical layout includes a plurality of nets routed to interconnect electronic components of the electrical circuit. The method also includes delineating a plurality of net segments for at least one of the nets of the physical layout, where each of the net segments has at least one physical property parametrically specified in value therefor. The method also includes selectively rendering on the display a plurality of segment indicators respectively corresponding to the net segments, where each of the segment indicators is adaptively positioned on the display spatially mapped to the net segment corresponding thereto as a symbolic surrogate for the corresponding net segment within the physical layout. The method also includes selecting one of the segment indicators. The method also includes determining a behavior of the electrical circuit product during operation consistent with electrical response of the corresponding net segment in accordance with the specified physical property thereof.

In accordance with still other embodiments of the present invention, a method is provided for interactive circuit layout design having spatially adaptive overlay indicative of parametric properties thereof. The method includes graphically rendering on a display a physical layout of an electrical circuit product to be manufactured, where the physical layout includes a plurality of nets routed to interconnect electronic components of the electrical circuit, and where a plurality of net segments is delineated for and mapped to at least one of the nets of the physical layout. The method also includes, responsive to an editing of the at least one net of the physical layout, re-rendering the edited net on the display. The method also includes, responsive to the editing of the at least one net of the physical layout, delineating a plurality of updated net segments for the edited net, exclusive of other nets of the physical layout. The method also includes, responsive to the delineation of updated net segments, determining a specified physical property of each updated net segment of the edited net, exclusive of other nets of the physical layout. The method also includes, responsive to the delineation of updated net segments, selectively rendering on the display updated segment indicators respectively corresponding to the updated net segments, where each of the updated segment indicators is adaptively positioned on the display spatially mapped to the net segment corresponding thereto as a symbolic surrogate for the corresponding net segment within the physical layout.

Additional aspects, details, and advantages of the disclosed system and method will be set forth, in part, in the description and figures which follow.

DETAILED DESCRIPTION OF THE PREFERRED EMBODIMENTS

Figure 1:
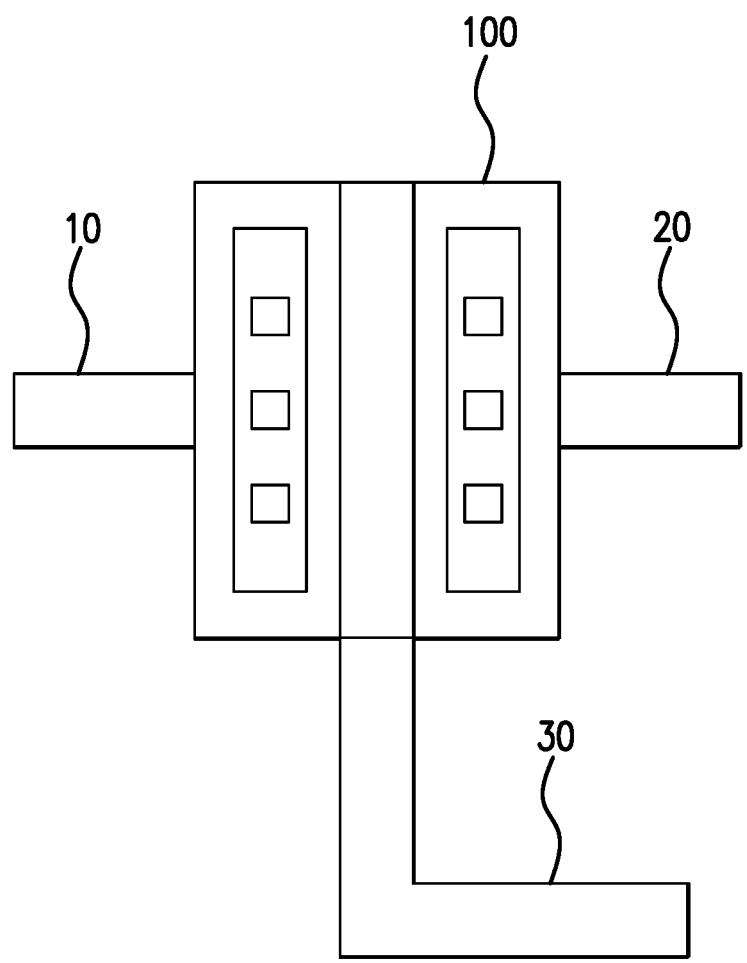
FIG. 1 is a depiction of an illustrative example of a circuit layout representing a portion of a circuit.

Reference will now be made in detail to exemplary embodiments, which are illustrated in the accompanying drawings, wherein like reference numerals refer to the like elements throughout. The embodiments are described below in order to explain the disclosed system and method by referring to the figures.

While exemplary embodiments will be described primarily in the context of computer assisted electronic circuit design, it will be appreciated by those of skill in the art that the principles described herein are applicable in other contexts.

Briefly, the subject system and method provide interactive circuit layout design with spatially adaptive overlay indicative of parametric properties thereof. More specifically, the system and method provide an efficient and visually intuitive association between the layout properties, such as dimensions and position, and the corresponding schematic properties, such as resistance and parasitic capacitance, of nets in a circuit design.

The association is preferably accomplished by organization of these properties into separate data structures of layout elements and schematic elements, respectively. In a preferred embodiment, the layout elements are rendered in a layout tab on a display according to the layout properties, while the schematic elements are represented in an overlaid indicator tab as indicators spatially mapped to the appropriate layout element. The layout elements may be selected for interaction when the layout tab is active, and the schematic elements may be selected for interaction when the schematic tab is active. The association between the elements is maintained, such that interaction with a layout element results in appropriate alteration to corresponding schematic elements, preferably with minimal or no alternation or attention to unrelated schematic elements.

This subject system and method enable rapid yet accurate determination and presentation of signal behavior within a circuit influenced by a net. The subject system and method also enable rapid yet accurate re-determination of schematic properties of a net responsive to editing of the layout properties of the net, without requiring reprocessing of the entire circuit design. The subject system and method also provide visual distinction between the layout and schematic elements, for ease of selection and manipulation, while also maintaining a visual correlation, for ease of comprehension.

For the purposes of this disclosure, an "electronic component" is any element of an electronic circuit designed and intended to alter or respond to a received electronic signal, unless otherwise noted. A wide variety of electronic components are known in the art, just a few exemplary types of which include active components such as transistors and diodes, passive components such as capacitors and transformers, and electromechanical components such as switches. For the purposes of this disclosure, a "net" is any conductive element of an electronic circuit designed and intended to transmit electricity or electric signals between two points without alteration, unless otherwise noted; nets are also sometimes called interconnections in the art. An electronic circuit product contains electronic components, as well as nets which are routed to interconnect the components and to transmit electric signals therebetween. For the purposes of this disclosure, electronic components and nets, as well as any other features of the circuit within the design, are collectively referred to as "circuit elements."

Despite not being designed or intended to do so, in practice a net is to some extent non-ideal in terms of its effects on an electronic signal, the exact effects dependent on factors such as the material of the net, its dimensions, and its position relative to other components. A net reduces the electric current of the signals it transmits due to the resistance inherent in any non-ideal conductor. Nets and other conductive elements in proximity to each other also produce parasitic capacitance, further affecting the signals in each. Although these influences on the signals are not by design, they must be accounted for in modern, precise circuitry.

In the design process, a schematic is preferably designed first, and represents the electronic components and how they connect without concern for physical size and spatial arrangement. At the schematic design stage, nets are largely implied, as the schematic generally presents connected components as if they were in direct contact. A physical layout is designed next; the layout expresses the physical "footprint" of each component in the circuit, and adds the placement of nets interconnecting the components, thereby establishing their length and routing. The layout therefore provides a spatial arrangement of the circuit elements of the design, including the nets.

For the purposes of this disclosure, "layout properties" are physical properties of a circuit element specific to the layout, including but not limited to dimensions and position, while "schematic properties" are physical properties of a circuit element presented in the schematic, including but not limited to resistance, capacitance, internal voltage, and component type. It is noted that layout properties may affect schematic properties—e.g. the dimensions of a net affect its resistance, and its position relative to another net affects their mutual parasitic capacitance—and schematic properties may affect layout properties—e.g. a specific component type may have specific dimensions. In some embodiments, for purposes of data storage both schematic properties and layout properties of many circuit elements are collectively stored in the same data structure; however, for convenience, this disclosure will treat these properties as respectively stored in separate, but in most cases associated, "schematic element" and "layout element" data structures.

For the purposes of this disclosure, a circuit product or its circuit elements are said to exhibit "behaviors" in response to any suitable form of direct or indirect electrical excitation known in the art. Such behaviors may be determined or expressed, for example, in terms of various electrical parameters such as voltage, current, charge, signal frequency or the like. Behaviors of nets may include, but are not limited to, the arrival timing of a signal transmitted therethrough at a predetermined point within a circuit element (such as the center or any terminus thereof), as well as a voltage, current, or temperature at the predetermined point at a predetermined timing. Both voltage and current may be plotted over time as they increase or decrease, resulting in voltage and current waveforms, which may also constitute behaviors. The electrical circuit product itself may also exhibit a behavior consistent with electrical excitation of its elements during circuit operation. Behavior is in accordance with the schematic physical properties of the element being excited, and may therefore be determined through a simulation of the electrical circuit product taking certain relevant schematic physical properties into account.

In an exemplary embodiment and illustrative application, a circuit editor is established. The circuit editor or related software generates a graphic rendering of the layout of the electronic circuit design, which is rendered on a display. FIG. 1 depicts a simple illustrative example of a circuit layout representing a portion of a circuit.

In the example layout of FIG. 1, an electronic component 100, more specifically a transistor, is connected to three nets 10, 20, and 30. In a circuit layout representing a complete electronic circuit, some or all of the nets would be also connected to other components, but for reasons of simplicity are not included in the figure. It is noted that a schematic design of the same portion of the circuit would merely be a single transistor symbol, which would have no relationship to the planned size or placement of electronic component 100; in a basic schematic, nets would not be represented.

Once a layout design is prepared to the satisfaction of the designer, in accordance with a previously prepared schematic design, it is known in the art as a "golden layout." At this stage, the layout elements in the layout are preferably associated with the equivalent schematic elements in the schematic design. The layout design and schematic design are thereby linked, with each schematic element associated to a layout element of the same circuit element, with both schematic and layout properties of the circuit element accessible through either design. This association can be done manually, either as the layout is prepared or afterward, but can also be processed automatically by a design tool in certain embodiments. This kind of automatic process is also known as "extracting" the elements from the layout.

One process known in the art for automatic association is "layout versus schematic," or "LVS" for short. LVS identifies electronic components in the layout by their appearance, according to a set of rules or "rule deck," and compares the identified electronic components to those in the schematic to determine the proper associations. As both the LVS process and other suitable processes for automatic element association are generally known in the art, they will not be elaborated upon further.

Circuits frequently include multiple layers of elements, which is accounted for in the layout design process. In preparation for LVS or various other automatic element association processes, these layers are in certain embodiments "flattened": that is, treated as a single layer, resulting in what appears to be elements from multiple layers occupying the same space. (An example of a flattened layout design can be seen in FIG. 3A, which will be fully described later herein.)

An automatic element association process will preferably also identify nets in the layout. Additionally, an automatic element association process, or related processes, will preferably determine the physical properties of each net, including schematic properties such as its inherent resistance and the parasitic capacitance between it and other nets. The schematic properties of a net can be determined based on its layout properties such as its dimensions, according to computations known in the art.

Because nets themselves are not included in schematic designs, an automatic element association process such as LVS has no schematic elements in the schematic design to associate with the net. Therefore, the automatic element association process preferably generates one or more schematic elements to associate with the net, in the form of one or more resistors and one or more capacitors, and inserts them at appropriate locations between the existing electronic components of the schematic design to produce an updated schematic design. (Preferably, the original schematic design is also maintained for reference.) By adding schematic elements to represent the nets, the updated schematic design may be simulated and tested to account for unintended effects on electronic signals passing through the nets. For example, in some embodiments the updated schematic design is converted to a netlist or other suitable model structure for electronic simulations which are known in the art.

It is noted that, in most design tools, a complete and simulatable schematic representation, or model, of a resistor or capacitor stores considerably more schematic properties than are necessary for the purposes of representing nets. Preferably, therefore, simplified resistor and capacitor models, each having a limited set of schematic properties including a resistance value or capacitance value as appropriate, are used in place of more complete resistor and capacitor models when representing nets. Suitable models for this purpose are available in the Open Access Parasitic Network standard (sometimes abbreviated as OAParasiticNetwork), the definitions of which are incorporated herein by reference. Other suitable models may also be conceived by those of skill in the art.

More accurate computations of the schematic properties, and more accurate simulation, will result if nets are divided into segments, each associated with at least one resistor and one capacitor in the schematic design. The delineation between segments may in various embodiments be determined according to user-selected settings, hard-coded settings, or other factors. The "detail" of delineation (e.g., the average number of segments per length of net) may be thought of as comparable to a number of significant digits in a data sample, and set accordingly; increasing the detail increases the accuracy of any simulation, at a cost of runtime and memory use.

It is noted that the representative capacitors being inserted in the design do not literally represent a capacitance "of" a net segment, but a parasitic capacitance of a pairing of proximate net segments in separate nets. Therefore, a capacitor representing this parasitic capacitance will be associated with both net segments, and will be considered when simulating the behavior of either.

Figure 2:
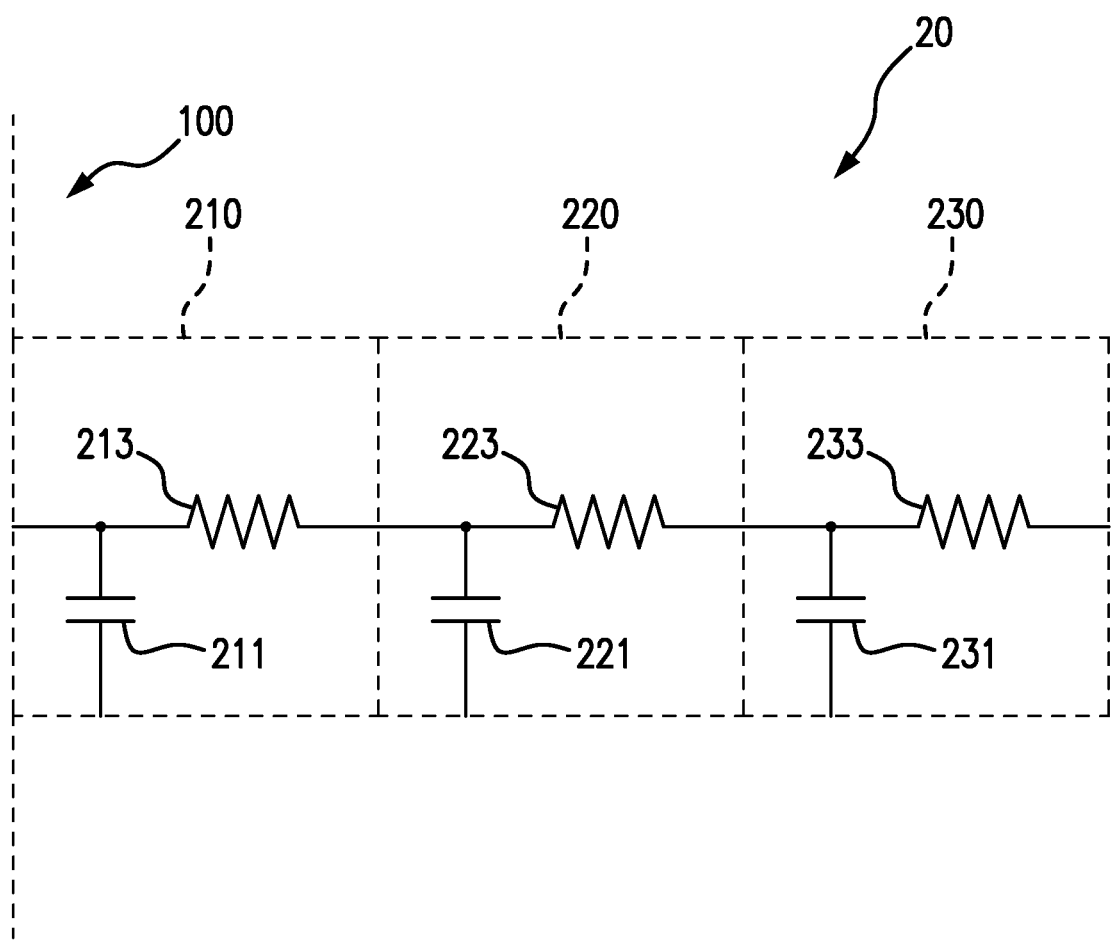
FIG. 2 is a schematic diagram illustrating an example of schematic element insertion applied to a portion of the circuit layout of FIG. 1, in accordance with an exemplary embodiment of the invention.

FIG. 2 is a schematic diagram depicting an illustrative example of a result of this schematic element insertion, as applied to net 20 in the example layout of FIG. 1. In this example, net 20 has been delineated into three net segments 210, 220, 230. Net segment 210 is associated with a capacitor 211 and a resistor 213, net segment 220 is associated with a capacitor 221 and a resistor 223, and net segment 230 is associated with a capacitor 231 and a resistor 233. (For convenience of depiction, the other net which, with net 20, generates the parasitic capacitance represented by capacitors 211, 221, 231 has been omitted.) Physical schematic properties are determined for each net segment based on the layout properties, and parametrically specified in value for the schematic elements associated with the net segment. In the illustrative embodiment, these schematic properties include a capacitance value for the capacitor associated with the net segment, and a resistance value for the resistor associated with the net segment. In other embodiments, the capacitor or resistor may be omitted, and the corresponding value need not be determined or specified.

For simplicity of depiction, FIG. 2 has depicted one representative capacitor and one representative resistor per net segment. However, in practice multiple resistors can be associated with a net segment. As one example, in practice a representative resistor is preferably inserted at both the very beginning and very end of net 20, thereby schematically representing net segment 210 (or, with different delineation of representation between segments, net segment 230) with two resistors instead of one. As another example, the number of representative capacitors necessary to determine capacitive effect on any net segment will be dependent on the number of other nets or other conductive elements in sufficient proximity.

The layout is preferably rendered in a display with interactive features for user interface purposes. If component association is complete, these interactive features may make use of schematic as well as layout properties. Referring back to the example layout of FIG. 1, after component association is complete, electronic component 100 is preferably rendered with an identifier label, indicating its component type (transistor), and potentially providing values of other schematic properties. Additionally, the rendering is preferably interactively presented in a graphical user interface: a user may select electronic component 100, or some sub-section thereof, to retrieve still more properties of the component, to actuate a simulation of the design related to electronic component 100 and thereby determine some behavior thereof, to edit either layout or schematic properties of electronic component 100, or other actions which can be conceived by those of skill in the art.

It is preferable that nets 10, 20, and 30 of the example layout are also rendered alongside electronic component 100 in a graphical user interface, and that the interface provide the same or similar interactivity for nets as for electronic components. However, because nets may be placed in a layout in numerous ways, a typical circuit layout editor treats a net as a connected series of net pieces for editing purposes, a new piece placed whenever the net changes direction, layer, or material, among other factors. The typical layout editor treats these net pieces in the same manner as other layout elements, with a unique set of layout properties, enabling simple editing of those properties by selecting the appropriate net piece. (A simple, straight net may be made of only one net piece, but for convenience this net piece and not the net itself will be treated as the layout element.) However, delineation of net segments begins with a complete net, not the pieces of the net, and may occur at different boundaries than net piece delineation. This breaks the one-to-one association between schematic element and layout element for nets, which in turn can complicate the process of selecting nets or net segments for any of the interactive purposes described above.

Figure 3B:
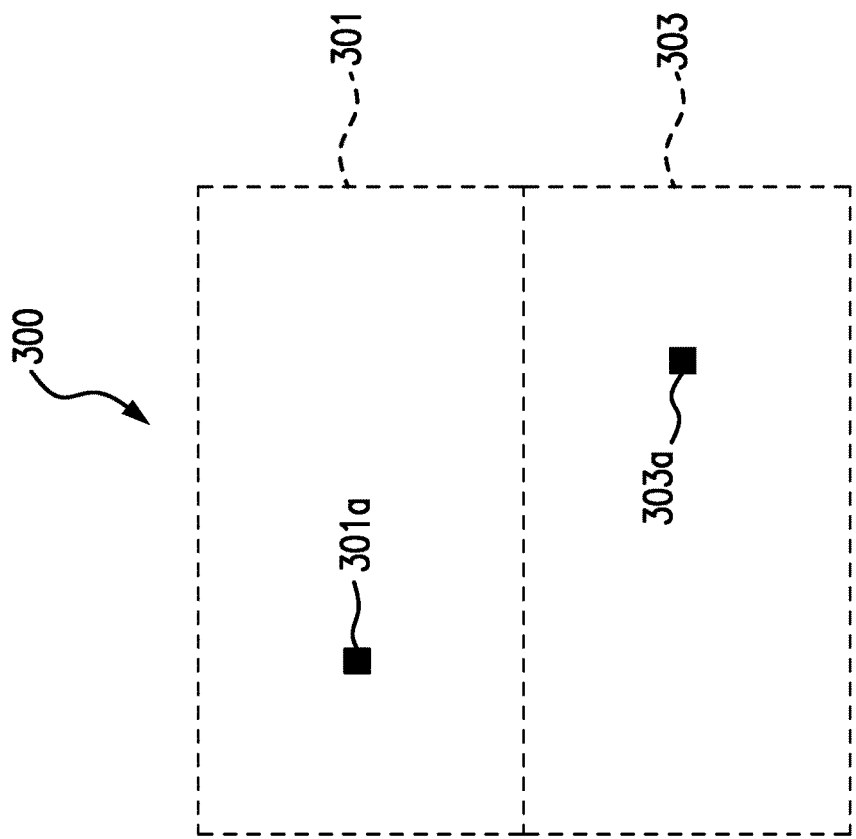
FIG. 3B depicts a graphic rendering of schematic elements of the example net of FIG. 3A, in accordance with an exemplary embodiment of the invention.
Figure 3A:
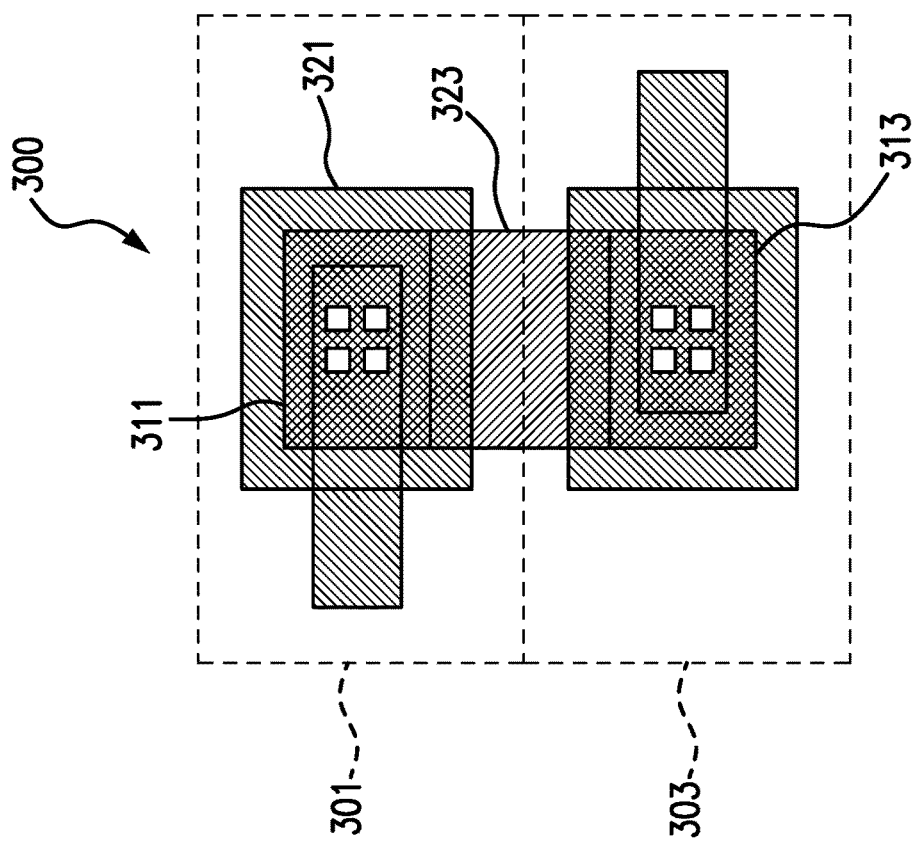
FIG. 3A depicts a graphic rendering of layout elements of an illustrative example of a net, in accordance with an exemplary embodiment of the invention.

FIG. 3A depicts an illustrative example of layout elements of a multi-piece net, graphically rendered according to an embodiment of the invention. Net 300 extends over two layers (each indicated in the figure with different hatching), and has multiple vias (indicated by lack of hatching) connecting the top and bottom layers through both of net structures 311 and 313. In a circuit layout editor implementing an interactive layout design, each piece of net 300, such as 311, 313, 321, and 323, is selectable, so that the positioning of the net or any piece thereof may be further edited. However, net 300 has been delineated into two net segments 301 and 303, and this delineation does not correspond to the arrangement of the pieces themselves.

Figure 4A:
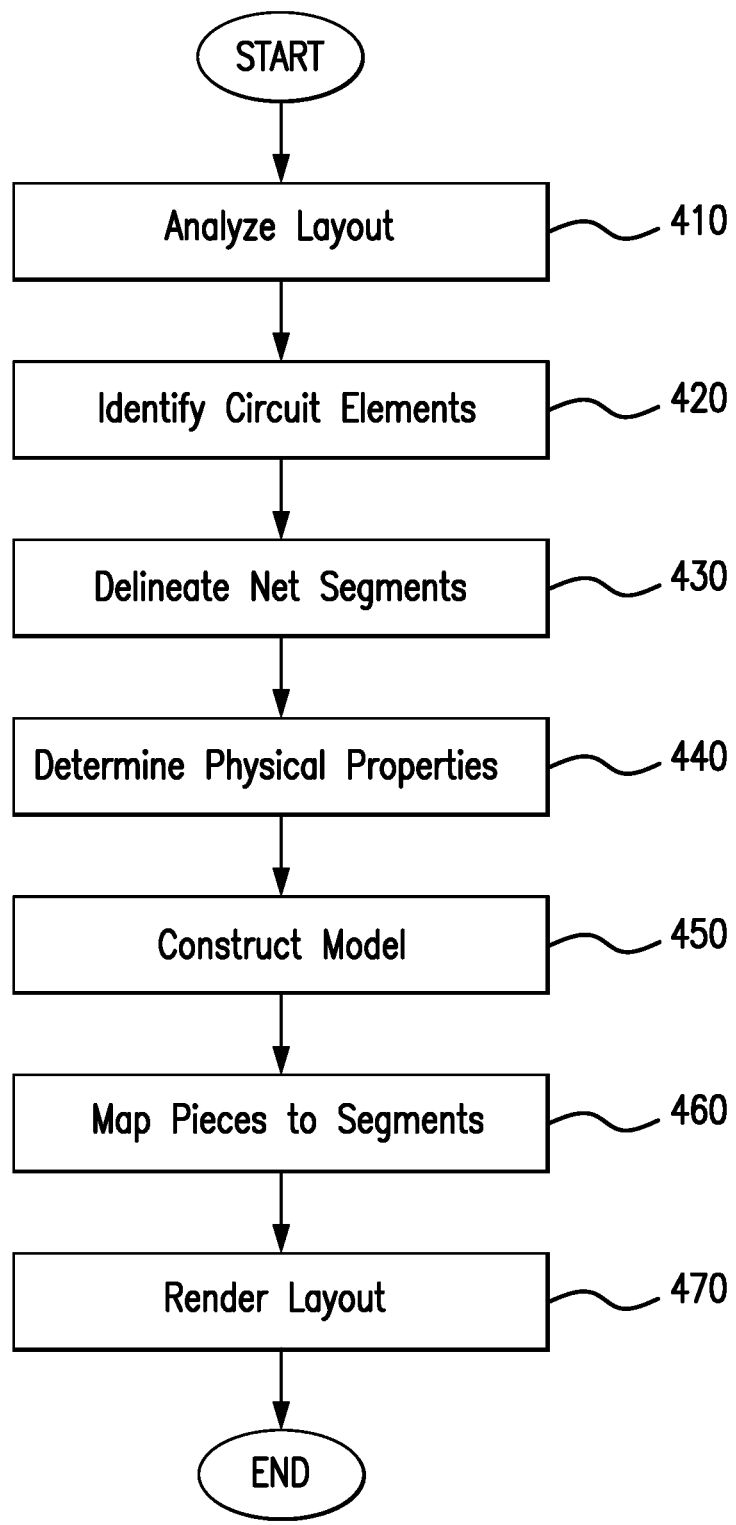
FIGS. 4A-4D are block flowcharts illustrating methods of rendering and presenting an interactive circuit layout, in accordance with various exemplary embodiments of the present invention.

One solution is to map each piece of net 300 to one or the other of the net segments 301, 303 through a suitable mapping process. FIG. 4A depicts a method of rendering and presenting an interactive circuit layout according to an exemplary embodiment of this solution.

In the depicted embodiment, at 410, a circuit layout with layout elements having specified layout properties is analyzed according to LVS or another suitable component association process, and the circuit elements are identified at 420. Preferably, the component association process identifies a contiguous sequence of net pieces as a single net.

At 430, identified nets are delineated into net segments. At 440, physical schematic properties are determined for each net segment, and preferably for the electronic components. For the net segments, these properties are preferably at least one of a capacitance value (in mutual association with a second net segment) and a resistance value; as previously noted, multiple capacitance values and resistance values are also possible in some embodiments for each net segment. In certain embodiments, other properties, including non-schematic properties, may also be determined.

Preferably, based on the identification of the elements in the circuit layout, and the determined schematic properties, schematic elements are generated and a circuit model is constructed at 450. In certain embodiments, this circuit model includes a netlist, but other suitable models are also known in the art. The schematic elements will include a simplified capacitor for each determined capacitance value, and a simplified resistor for each determined resistance value.

At 460, each net piece in the circuit layout is mapped to a net segment, and at 470, the layout elements are rendered in a graphical user interface on a display. In various embodiments, the net elements are also made selectable to enable interactive features which can include, but are not limited to, one or more of those described previously.

Figure 5A:
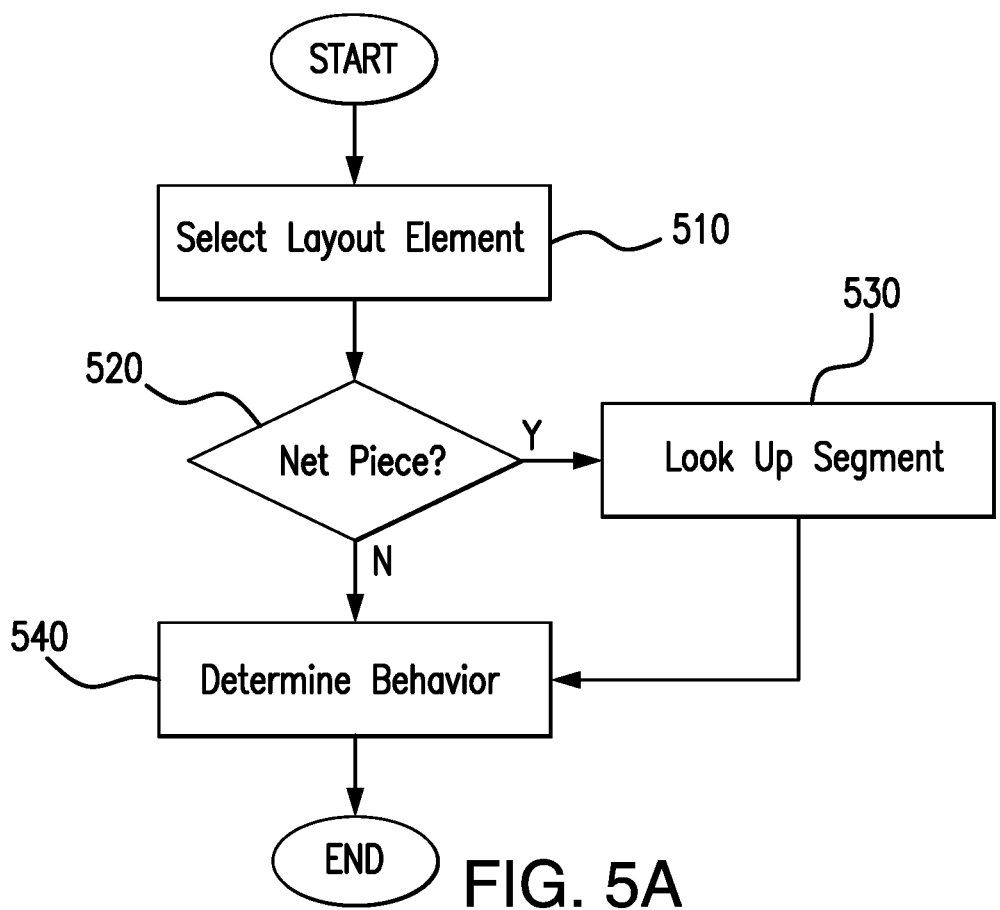
FIGS. 5A-5D are block flowcharts illustrating methods of selecting and interacting with circuit elements, in accordance with various exemplary embodiments of the present invention.

Preferably, as previously disclosed, the interactive features of the graphical user interface include determinations specific to a selected circuit element, such as a simulation determining the behavior of an electronic signal within the element, or of the circuit product itself when the circuit element responds during operation to some form of electrical excitation. FIG. 5A depicts a method of selecting and interacting with circuit elements according to an exemplary embodiment of the solution.

At 510, a layout element is selected through the user interface or other suitable method. For the purposes of this method, a layout element includes any net piece. Therefore, at 520, it is determined whether a net piece is selected. If the selected layout element is not a net piece, it is an electronic component, and a one-to-one correspondence to a schematic element can be assumed. However, if the selected layout element is a net piece, then at 530, a suitable look-up process is employed to determine the corresponding net segment.

In either case, the process concludes in this example method at 540. In the example method, operation 540 determines a behavior of the circuit element. In various embodiments, behavior may be determined through a simulation of part or all of the complete circuit model, or a recall of the appropriate results of a prior simulation if they were stored and if the parameters of the complete circuit model have not been altered since that prior simulation. Other suitable methods for this determination may also be imagined by those of skill in the art. It is noted that numerous other operations requiring designation of a specific schematic element may replace operation 540 in other methods, which are not depicted but within the scope of the invention; as but one example, the schematic properties of the schematic element may be edited upon its selection.

According to the depicted method of FIG. 5A in reference to FIG. 3A, upon selection at 510, for example, net piece 321 of FIG. 3A, it is determined at 520 that the selected layout element is a net piece, so the look-up process determines at 530 that net piece 321 is mapped to net segment 301, and a behavior determination (or other interaction) for that net segment proceeds accordingly at 540.

However, this mapping requires extra memory storage; as is seen in the illustrative example of FIG. 3A, each net may be constructed of numerous net pieces, each of which must be mapped. The mapping also adds extra operations 520 and 530 to the interaction, which must be repeated whenever a new net piece is selected, and each look-up 530 in particular can require noticeable runtime due to the number of net pieces and net segments for even an average-sized circuit design.

Additionally, as segment delineation typically has no relationship to the pieces of the net themselves, a net segment boundary may fall in the middle of a net piece, as it has in the depicted example for net piece 323; it is therefore unclear whether net piece 323 should be mapped to net segment 301 or net segment 303. More generally, the mapping solution does not intuitively communicate to a user that a collection of net pieces is being treated as a single net segment for simulation and schematic property purposes. (It is noted that the boundaries of net segments 301 and 303 would not be rendered in the display.)

Figure 4B:
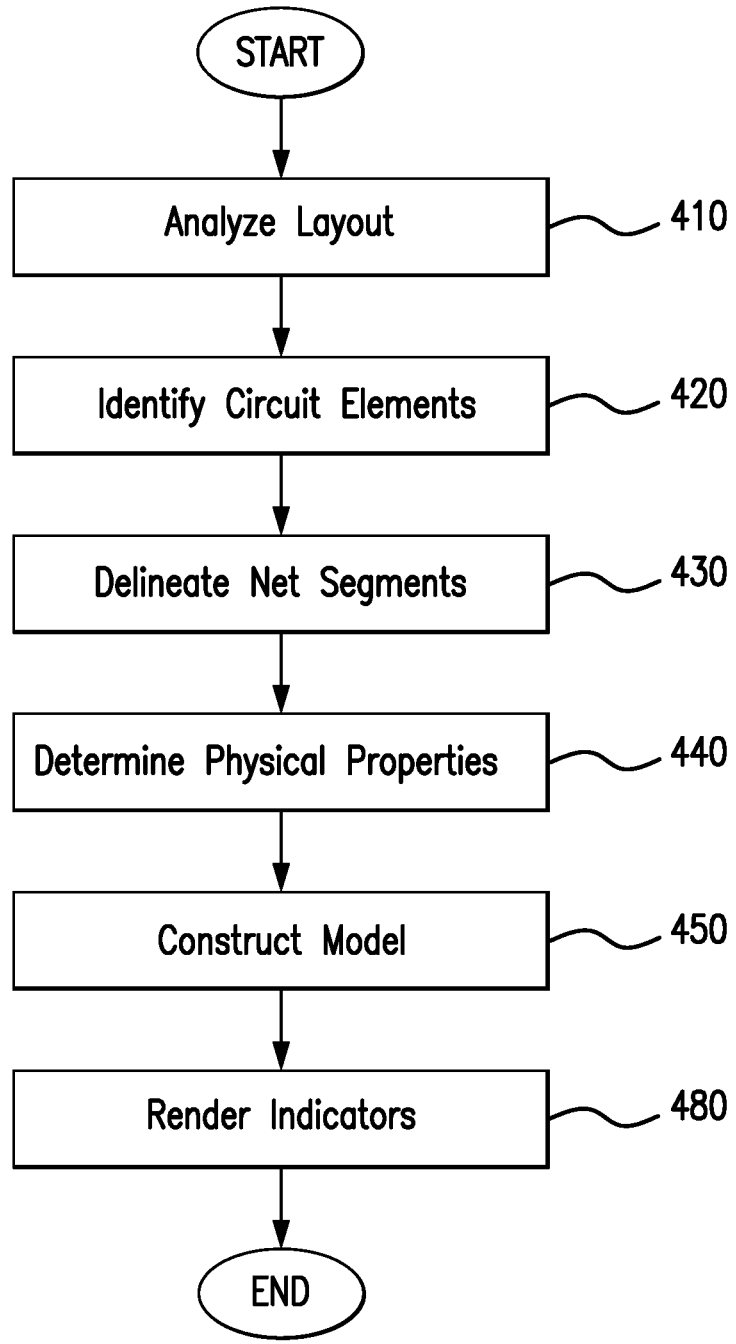

A second solution is to generate selectable indicators for each net segment. FIG. 4B depicts a method of rendering and presenting an interactive circuit layout according to an exemplary embodiment of this second solution. This method is similar to that of FIG. 4A, but the net piece mapping 460 is omitted. Additionally, the layout rendering 470 is replaced with rendering selectable segment indicators, at 480. Each segment indicator corresponds to a net segment and is preferably adaptively positioned within the display to be spatially mapped to the position of the net segment within the layout.

In certain embodiments, the indicator rendering 480 of the method of FIG. 4B renders and positions similar selectable indicators for electronic components. In other embodiments, the electronic components are rendered as selectable layout elements, as they are in the solution of FIG. 4A.

FIG. 3B depicts the example net 300 of FIG. 3A rendered in an interface as part of the method of FIG. 4B, according to an embodiment of the invention. In place of the layout itself, selectable segment indicators 301a and 303a are positioned to serve as symbolic surrogates for net segments 301 and 303 respectively. In certain embodiments, the segment indicators are adaptively positioned at some predetermined location relative to the net pieces which collectively correspond to the corresponding net segment, such as a center or an edge of the collective set of net pieces. In other embodiments, the segment indicators are adaptively positioned at some predetermined location relative to the boundaries of the corresponding net segment, such as a center or an edge of the boundaries. In still other embodiments, the boundaries of net segments 301 and 303 are rendered visibly, and the entire space of each segment made a selectable segment indicator.

Figure 5B:
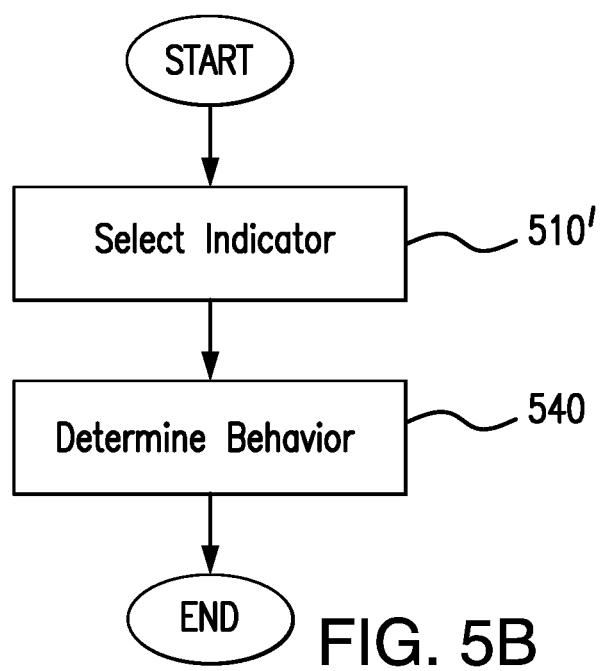

As there is a one-to-one correspondence between the segment indicators and the net segments, no mapping or look-up process is necessary. FIG. 5B depicts a method of selecting and interacting with circuit elements according to an exemplary embodiment of this second solution. In the embodiment of FIG. 5B, an indicator is selected at 510', and then the process immediately moves to 540 to determine the behavior of the corresponding schematic element (or, as previously noted, take other action related to the schematic element).

Additionally, it is intuitively clear to a user how many net segments are present. For example, in the illustrative example of FIG. 3B, there are two indicators visible and therefore two net segments.

However, if the layout elements shown in FIG. 3A are removed, as depicted in FIG. 3B, a user cannot determine the physical layout of the net involved; for example, the user cannot see from FIG. 3B that the two indicators represent connected net segments of a single net, or the arrangement of that net. Additionally, the user cannot edit the layout of the net by selecting the net pieces. This second solution is therefore more limited in its functionality.

Figure 4C:
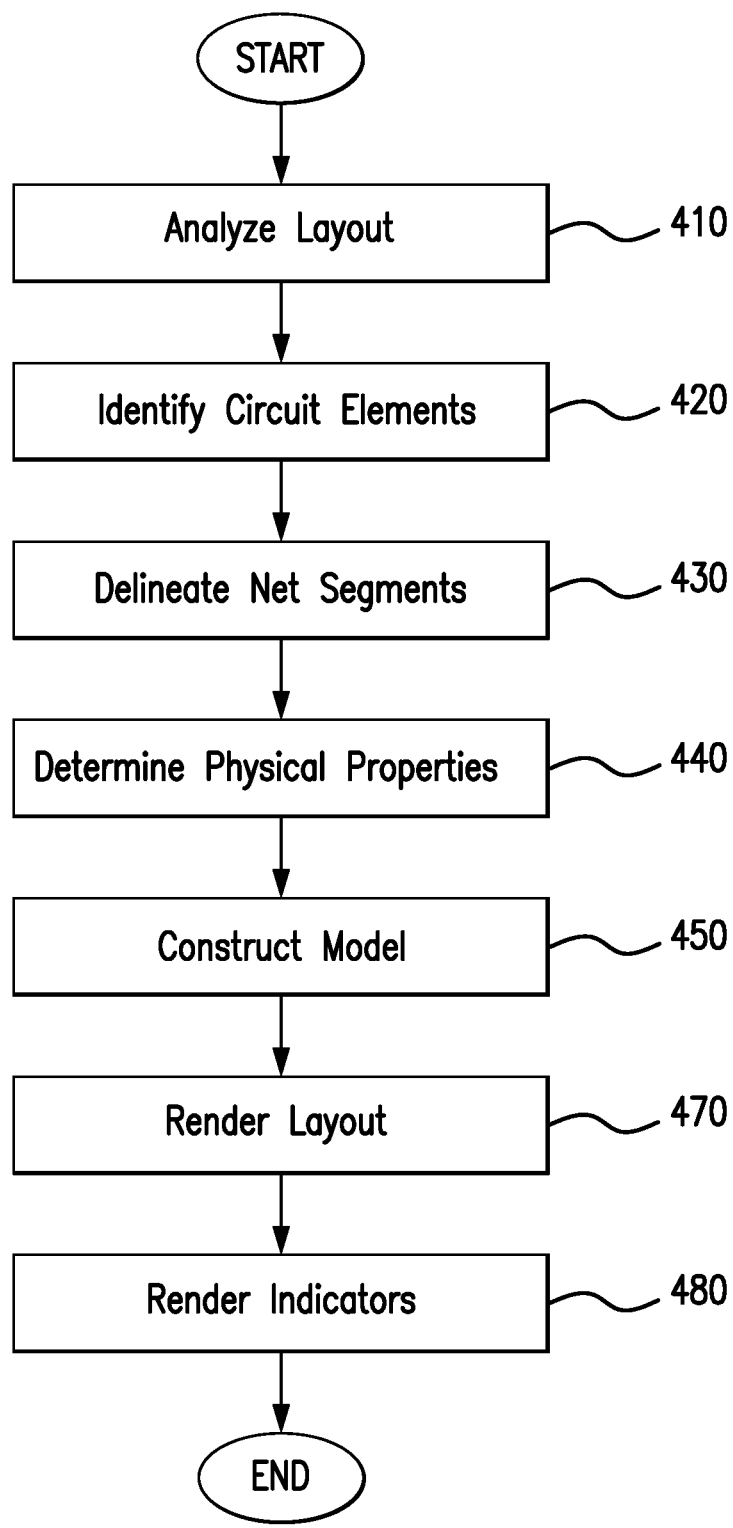

A third solution renders both the indicators and the layout. FIG. 4C depicts a method of rendering and presenting an interactive circuit layout according to an exemplary embodiment of this third solution. This method is similar to that of FIG. 4B, but the layout rendering 470 of the exemplary method of FIG. 4A is included, preceding the indicator rendering 480. The indicators are therefore rendered "on top of" the layout elements, covering the layout elements where they overlap in position; that is, they form an overlay upon the layout elements.

Figure 3C:
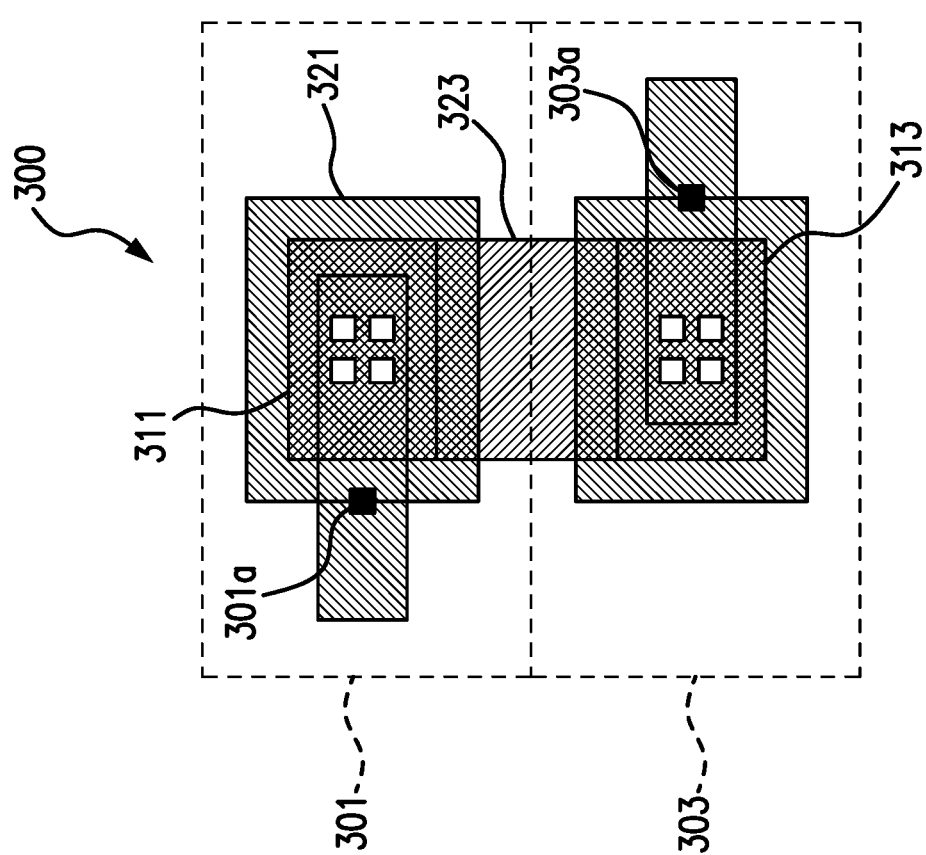
FIG. 3C depicts a graphic rendering of the example net of FIG. 3A which combines layout and schematic elements, in accordance with an exemplary embodiment of the invention.
Figure 5C:
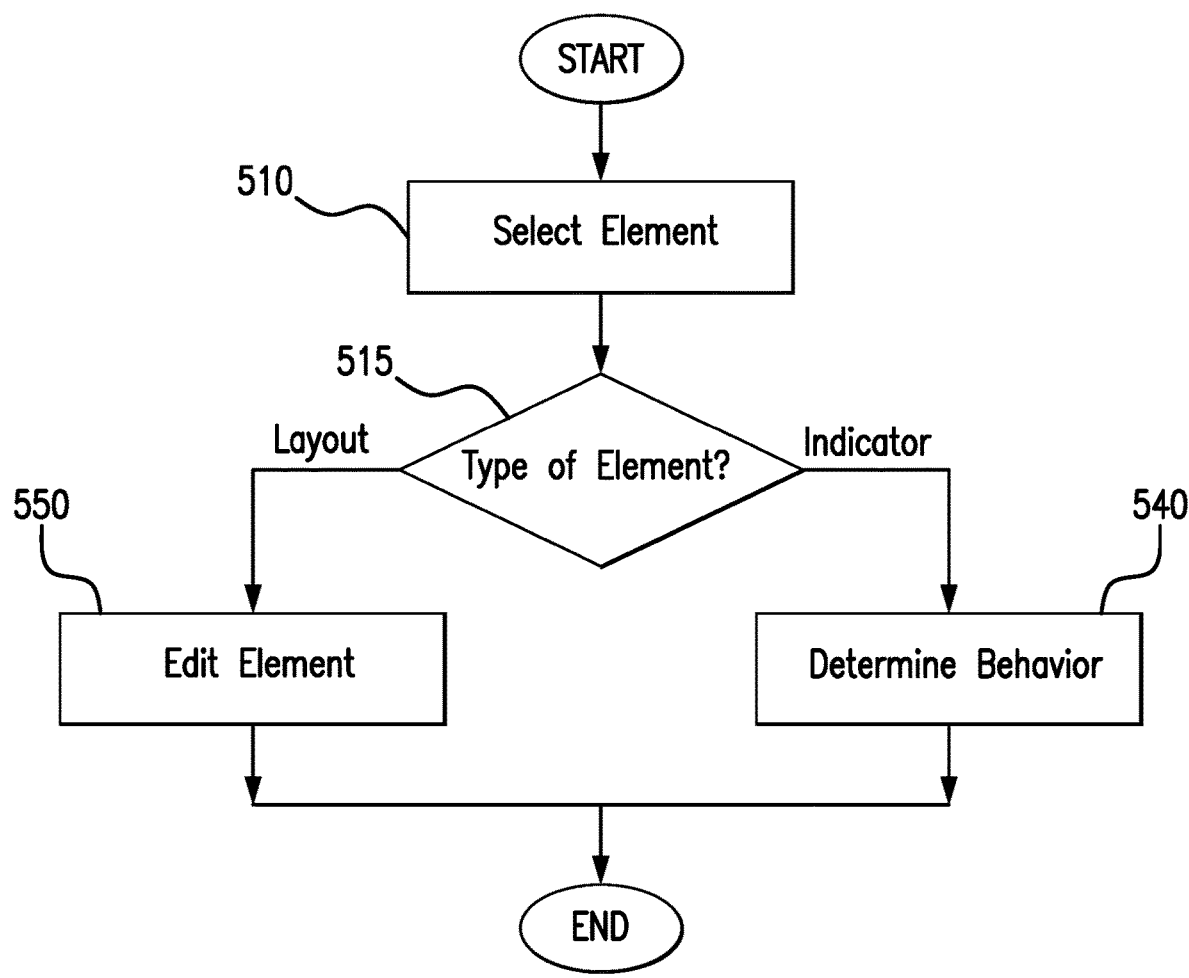

FIG. 3C depicts the example net 300 of FIG. 3A rendered in an interface as part of the method of FIG. 4C, according to an embodiment of the invention. Segment indicators 301a and 303a have been overlaid at 480 upon the layout elements rendered in 470, and spatially mapped to their corresponding net segments 301 and 303. For nets, interactions specific to schematic elements (e.g., net segments) and properties, such as determining electrical behavior, are actuated when a segment indicator, such as segment indicator 301a, is selected. This selection may be accomplished using, for example, the exemplary method depicted in FIG. 5C. In the embodiment of FIG. 5C, an element of any type is selected at 510, and it is then determined if it is a layout element or indicator at 515. If it is an indicator, then the process moves to 540 to determine the behavior of the corresponding schematic element (or, as previously noted, take other action related to the schematic element). If it is a layout element, interactions specific to layout elements (e.g. net pieces) and properties, such as editing a net piece's dimensions and position, are actuated at 550.

However, the distinction between the segment indicators and the net pieces is potentially unclear, leading to user confusion; an indicator may be mistaken for a net piece or vice versa. Also, the indicators potentially impede selection of any net pieces occupying the same position. Additionally, the interface is unintuitive as to which interactions should actuate when selecting an electronic component, as each component is both a layout element and a schematic element.

Figure 4D:
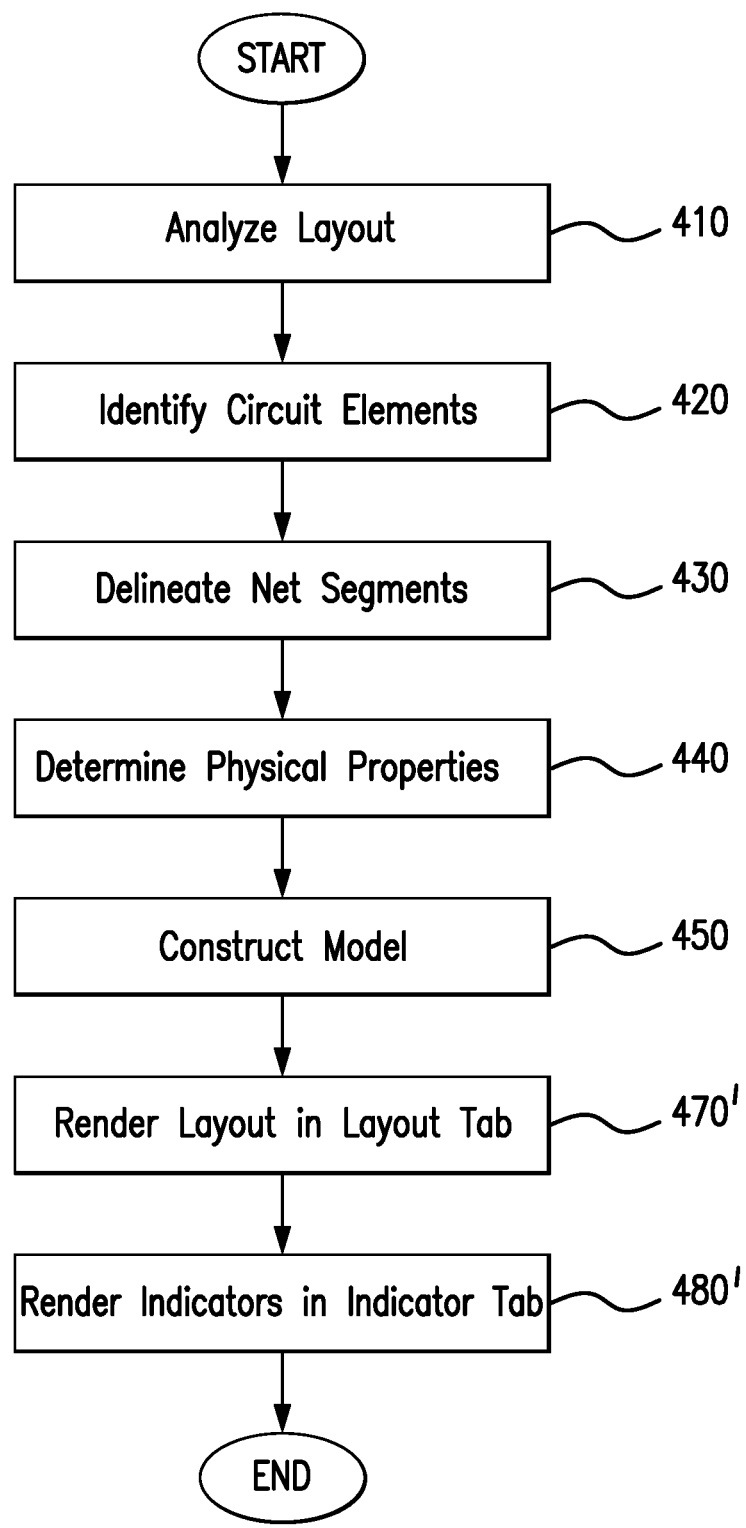

A fourth and preferable solution also renders both the indicators and the layout, but in distinct tabs. FIG. 4D depicts a method of rendering and presenting an interactive circuit layout according to an exemplary embodiment of this fourth solution. This method is similar to that of FIG. 4C, but the layout rendering 470 is altered to render said layout in a layout tab at 470', and the indicator rendering 480 is altered to render said indicators in an indicators tab at 480'.

Figure 6B:
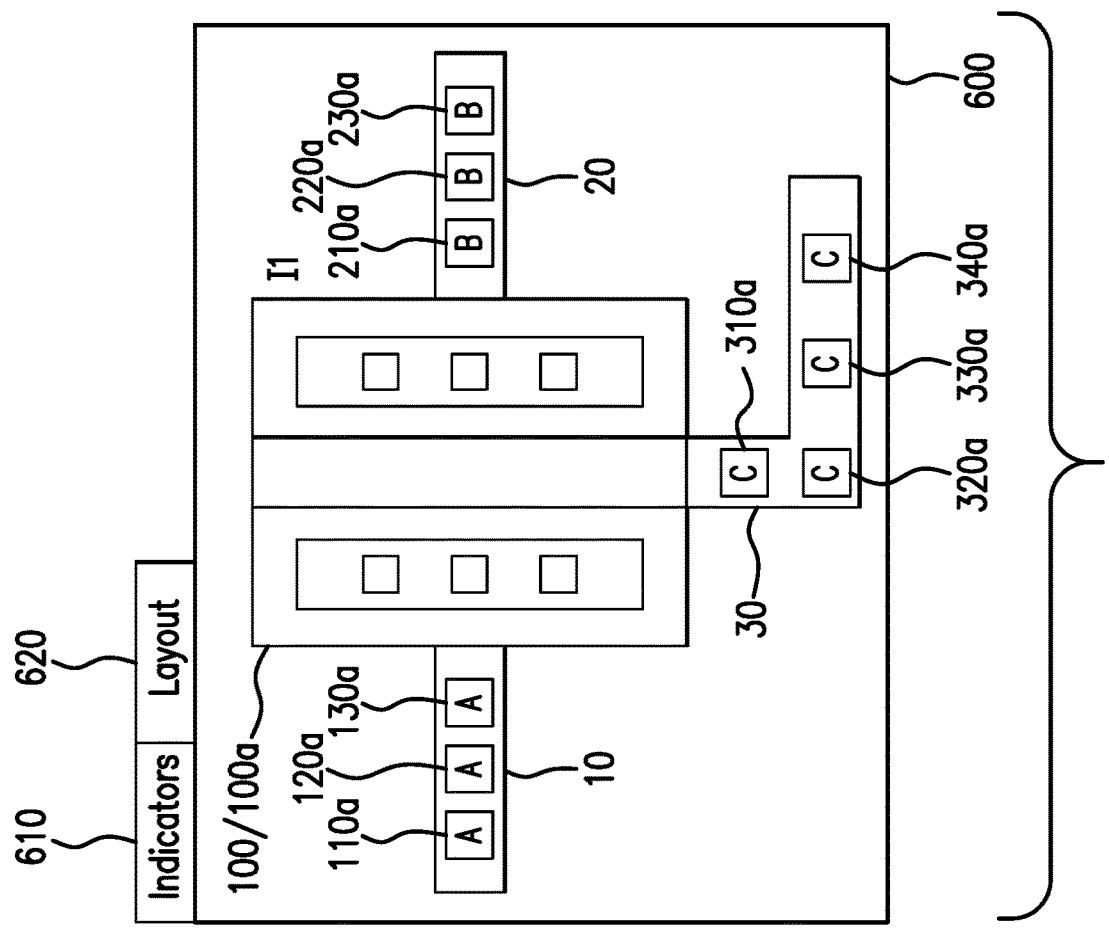
FIG. 6B depicts a tab-based interface graphically rendering the example circuit layout of FIG. 1, in accordance with an exemplary embodiment of the invention.
Figure 6A:
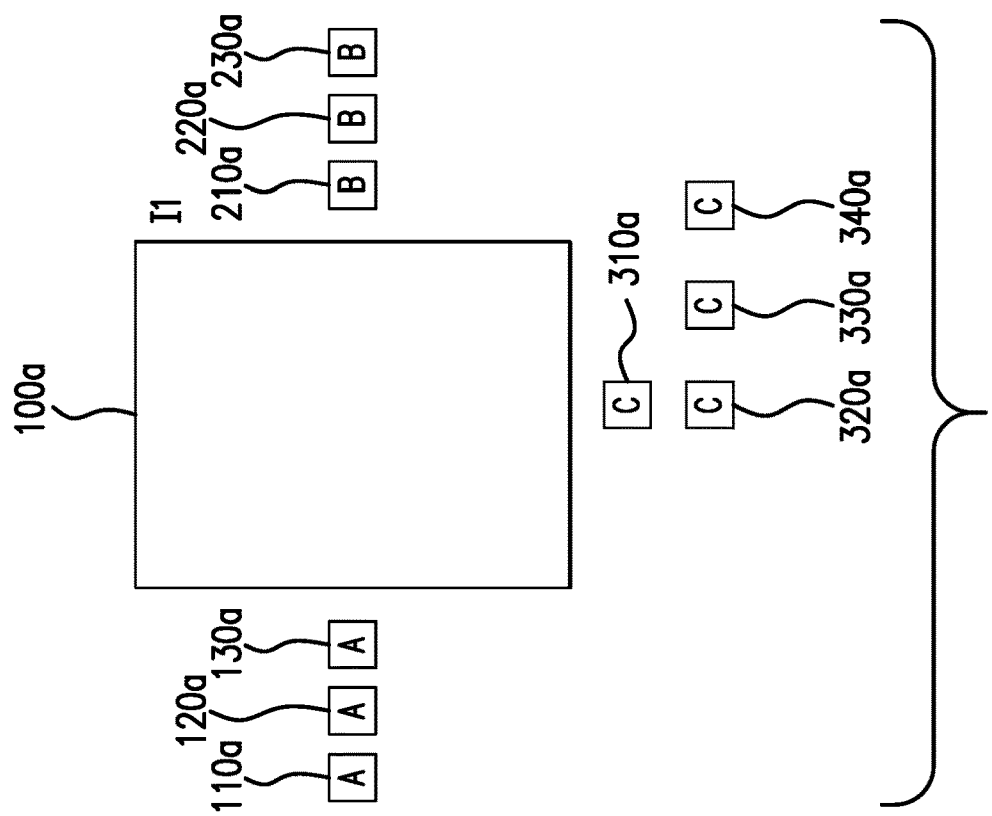
FIG. 6A depicts a graphic rendering of schematic elements of the example circuit layout of FIG. 1, in accordance with an exemplary embodiment of the invention.

FIGS. 6A and 6B depict the example layout of FIG. 1 rendered in an interface as part of the method of FIG. 4D, according to an embodiment of the invention. More specifically, FIG. 6A depicts indicators rendered in an indicator tab 610, while the contents of FIG. 1 (all layout elements) are rendered in a layout tab 620. As depicted in FIG. 6B, the contents of both tabs are visible in an interface window 600, with the indicators overlaid upon the layout elements. (It is noted that the method of FIG. 4B, applied to the example layout depicted in FIG. 1, would generate the contents of FIG. 6A—that is, the contents of the indicator tab 610—without the corresponding layout tab contents. It is also noted that the method of FIG. 4C, applied to the example layout depicted in FIG. 1, would generate the contents of FIG. 6B but without the individual tabs 610 and 620.)

Specifically, in the depicted illustrative application, indicators 110a, 120a, and 130a are overlaid upon net 10 to indicate three net segments thereof. Indicators 210a, 220a, and 230a are likewise overlaid upon net 20 to indicate three net segments thereof. Indicators 310a, 320a, 330a, and 340a are likewise overlaid upon net 30 to indicate four net segments thereof. Finally, an indicator 100a is overlaid upon electronic component 100; in this illustrative application, the indicator and the component occupy identical spaces. All indicators in this illustrative application have visible labels to designate the corresponding element (e.g. "I1" for indicator 100a to refer to corresponding electronic component 100, "A" for each of indicators 110a, 120a, 130a to refer to corresponding net 10), but in certain embodiments, these labels are omitted and the indicators stand alone.

In this fourth solution, the user interface enables switching between active tabs. Although both the layout and the indicators are visible regardless of which tab is active, the contents of the selected tab are preferably emphasized while the contents of the unselected tab are preferably deemphasized. In some embodiments, this emphasis is accomplished through bold outlines around the active contents; in other embodiments, it is accomplished through brighter, less subdued coloration for the active contents than for the inactive contents. Still other means of emphasis will be known by or conceivable to those of skill in the art. (It is noted that none of these means are depicted in FIG. 6B.)

Figure 5D:
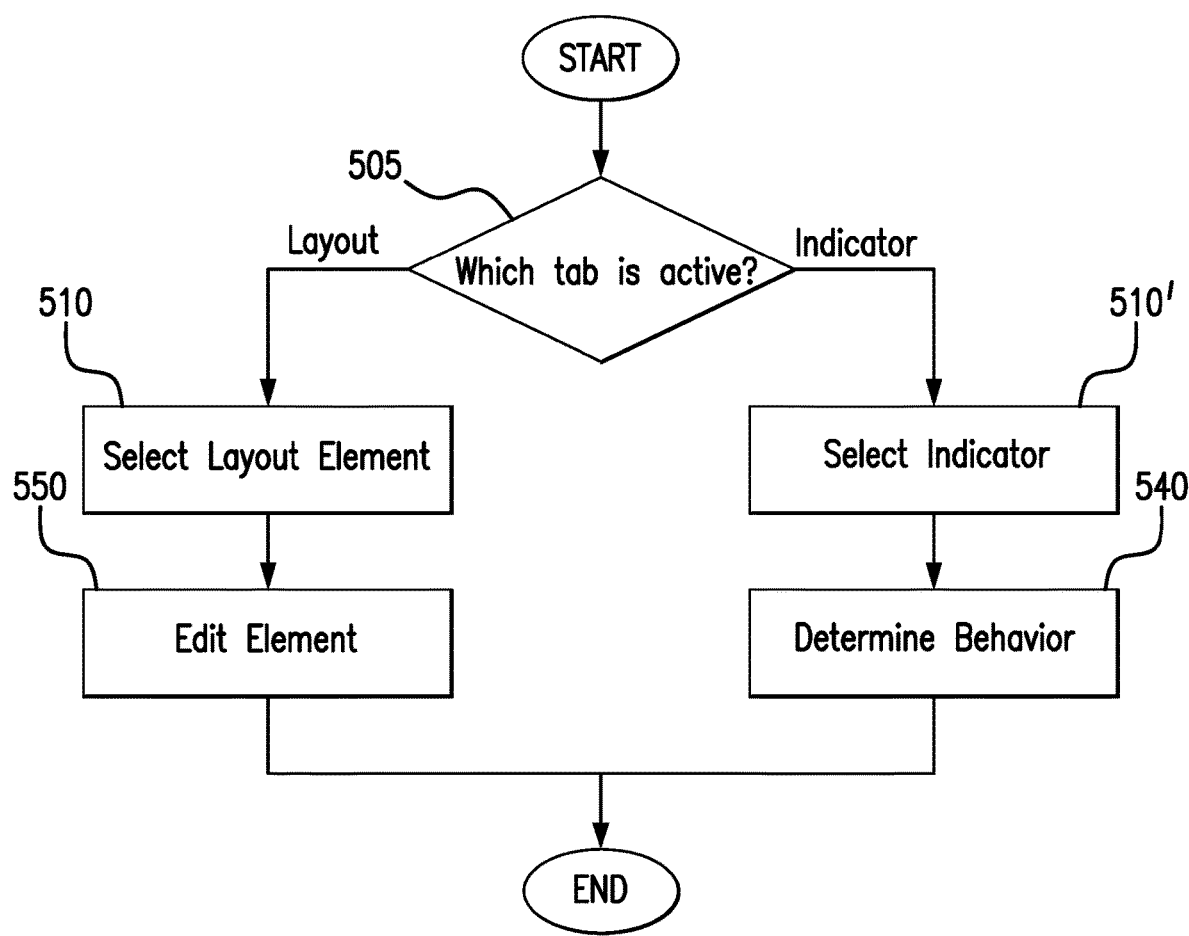

When employing both layout and indicator tabs, selection of layout elements and indicators is simplified. FIG. 5D depicts a method of selecting and interacting with circuit elements according to an exemplary embodiment of this fourth solution. In the embodiment of FIG. 5D, at 505, it is determined whether the layout tab or the indicator tab is active. If the layout tab is active, any layout element such as a net piece may be selected at 510, and then layout properties of the element, such as position and dimensions, may be edited (or another layout-related operation may be completed) at 550. If the indicator tab is active, any indicator may be selected at 510', and then a behavior may be determined (or another schematic-related operation may be completed) at 540.

By including tabs in the fourth solution, the drawbacks of the third solution are reduced or eliminated. Active contents are emphasized, resulting in a clearer distinction between indicators and layout elements. Because only active contents may be selected, the overlaid nature of the indicators does not interfere with selection of layout contents beneath. Finally, the interface actuates layout interactive features or schematic interactive features according to which tab is active, reducing confusion as to which interface features are desired.

Two solutions were compared against an existing system when representing a circuit design containing 264 electronic components. The results are compared in the following table.

TABLE 1

|  | Prior Art | Solution 1 | Solution 4 |
| --- | --- | --- | --- |
| Components | 264 | 264 | 264 |
| Net segments | 2078 | 2078 | 2078 |
| Net pieces | 42096 | 42096 | 42096 |
| Full net schematic models | 7500 | none | none |
| Simple net schematic models | none | 7500 | 7500 |
| Selectable schematic elements | 42096 | 42096 | 2078 |
| Segment mappings | 0 | 2078 | 0 |
| Segment references | 0 | 0 | 2078 |

The "Prior Art" column describes the results in a prior art system which does not use simplified net schematic representation (that is, the simplified resistor and capacitor models). The "Solution 1" and "Solution 4" columns describe the results of the first solution (e.g. FIG. 4A) and fourth solution (e.g. FIG. 4D), respectively.

As can be seen from the comparison, both solutions improve on the prior art by replacing the full models for net segment schematic features with an equivalent number of simplified models, considerably reducing the size of a complete schematic model of the design, and also the processing power, memory, and runtime necessary for simulations using the model. Solution 1, however, still requires that each net piece have a selectable element in the schematic interface, requiring a heavy rendering and processing runtime. Additionally, Solution 1 requires that each net segment have a mapping to its corresponding net pieces, in this example averaging about twenty pieces to each segment. A suitable data structure for this mapping will require its own storage space, and a mapping lookup process such as operation 530 of FIG. 5A must search these mappings whenever a net piece is selected.

Solution 4 replaces each mapping data structure with a simple one-to-one reference ID connecting each indicator and each segment, such as an integer or other suitable unique label, conserving additional space and eliminating a potentially costly lookup operation. Solution 4 also greatly reduces the number of selectable elements in the schematic interface (that is, the indicator tab) to the number of net segments itself, reducing rendering time for the interface. (It is noted that all net pieces must still be rendered in the layout tab and their layout properties stored accordingly, but as they are disconnected from any schematic properties for interface purposes, the processing and storage necessary for rendering and managing the layout tab is considerably reduced.)

Similar results were observed in testing on other circuit designs of similar complexity.

Once net segments have been successfully and efficiently implemented, additional benefits may be realized in certain preferred embodiments. Some such benefits are described below.

Simulation of a circuit model is a lengthy process for a complex circuit, and it is desirable not to run more simulations than necessary. This can be partially avoided by running the simulation once, then storing all the results and referring back to them as needed. However, storing useful results of a simulation for every schematic element in a complex circuit can be unwieldly; the savings in runtime come at the expense of storage, especially for results which include waveforms or similarly-complex determinations.

Additionally, any edits to the properties of any element in the circuit will alter the results, requiring a new simulation. Worse, these edits will also require redetermination of schematic properties of altered nets, so as to generate updated schematic elements to associate with the net. As previously noted, an automatic element association process such as layout versus schematic (LVS) may make such determinations and associate the proper schematic models with the nets. However, LVS and other prior art automatic element association processes require analysis of the entire circuit design. A circuit designer tends to focus on improving a particular section or even a single net of the circuit design for an extended period, and re-analyzing and re-simulating the entire circuit design for each alteration to a single net is a waste of runtime and processing power.

Figure 6C:
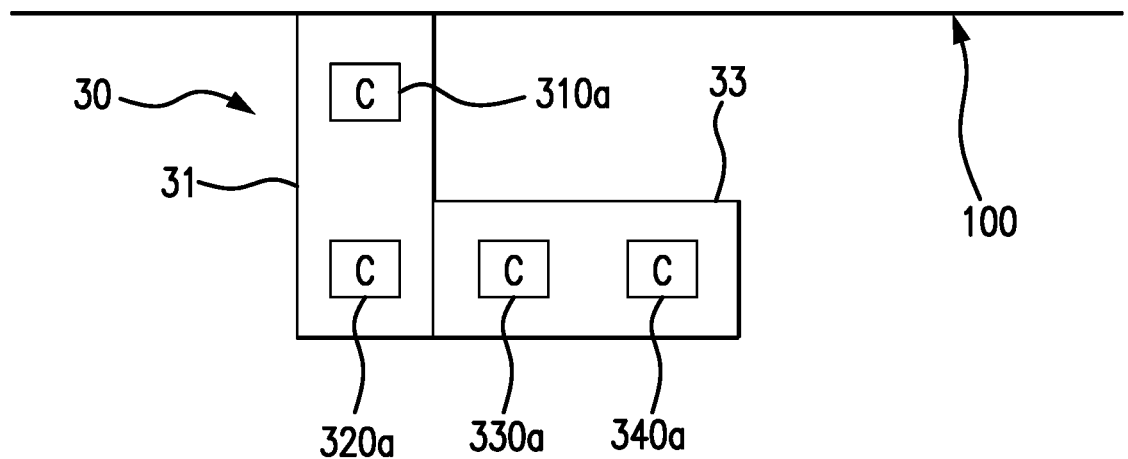
FIG. 6C depicts a magnified portion of a tab-based interface graphically rendering the example circuit layout of FIG. 1, in accordance with an exemplary embodiment of the invention.

A middle ground of incremental schematic feature extraction is made possible by the solutions described above. Each segment indicator in the indicator tab is associated with a net, and each net piece in the layout tab is likewise associated with a net. For example, FIG. 6C depicts a magnified portion of a tab-based interface of FIG. 6B or a similar interface, focused on net 30. In this depiction, two individual net pieces 31 and 33 of net 30 are distinguished. (It is noted that, in various embodiments, the boundaries between net pieces may or may not be visible in the interface.) As previously noted, segment indicators 310*a*, 320*a*, 330*a*, and 340*a* are also associated with net 30, and more specifically with respective net segments of net 30. Net pieces 31 and 33 signify the layout properties of net 30, and may be edited in the layout tab to alter those layout properties, while segment indicators 310*a*, 320*a*, 330*a*, and 340*a* signify the schematic properties of net 30, and may be edited in the indicator tab to alter those schematic properties.

Figure 6D:
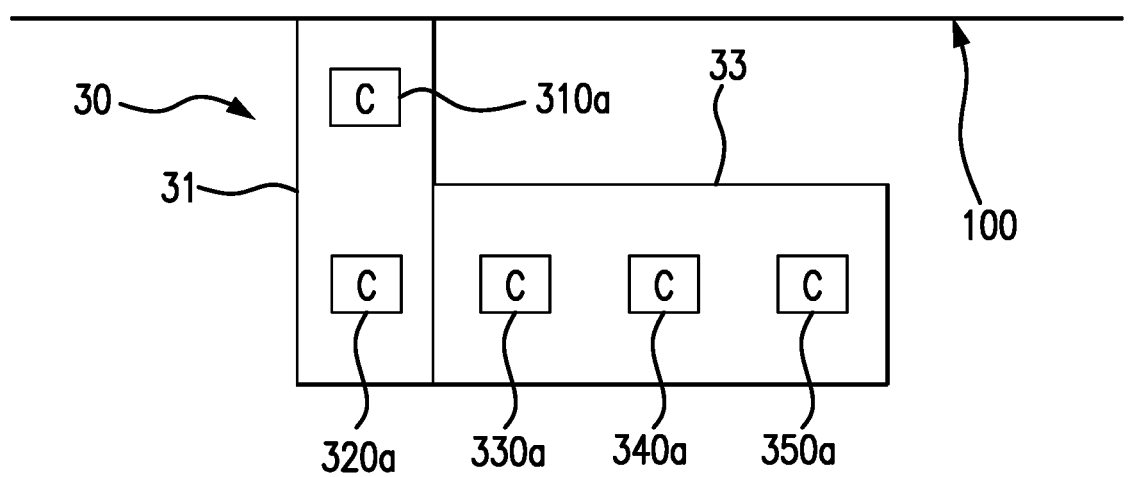
FIG. 6D depicts a magnified portion of a tab-based interface graphically rendering an edited version of the example circuit layout of FIG. 1, in accordance with an exemplary embodiment of the invention.

FIG. 6D depicts the contents of FIG. 6C after a designer has widened and lengthened net piece 33, thereby altering its layout properties, and by extension the layout properties of net 30. Because layout properties can affect schematic properties, the schematic properties of net 30 must be re-determined. However, rather than reanalyzing the entire circuit design, the use of indicators allows this schematic feature extraction to be incremental; that is, to be isolated to the altered net. The system may simply discard the indicators associated with the altered net and reanalyze the net for its schematic properties, while preserving the indicators and schematic properties associated with other circuit elements. In the depicted example, a new delineation has increased the number of net segments in net 30 to five, requiring an additional segment indicator 350*a*. Although schematic properties are not depicted in FIGS. 6C and 6D, it can be assumed that these have also been updated for each segment in net 30. However, the indicators and properties for other circuit elements in the larger design will remain unaltered.

Additionally, a designer may designate a schematic element for observation. A simulation runs to determine one or more schematic behaviors of, or influenced by, that schematic element, such as the timing of a signal passing through the element, or the voltage or current waveform of the signal as it enters or leaves the element. This simulation is shortened in runtime from a complete simulation, because it can be determined which other schematic elements in the circuit will influence the schematic behaviors related to the designated schematic element, and the simulation can be limited to those elements. The schematic behavior results specifically for the designated schematic element are then stored and made retrievable, while preferably the results for other schematic elements are not stored, conserving storage space.

If the designated schematic element, or some schematic element influencing its schematic behaviors, is altered, the shortened simulation is automatically run again, in some embodiments upon user confirmation, and the updated results for the designated schematic element stored. In this manner, a designer may observe a particular schematic element while altering it and surrounding elements, in an effort to achieve or maintain particular results, without excessive simulation or storage.

Figure 7:
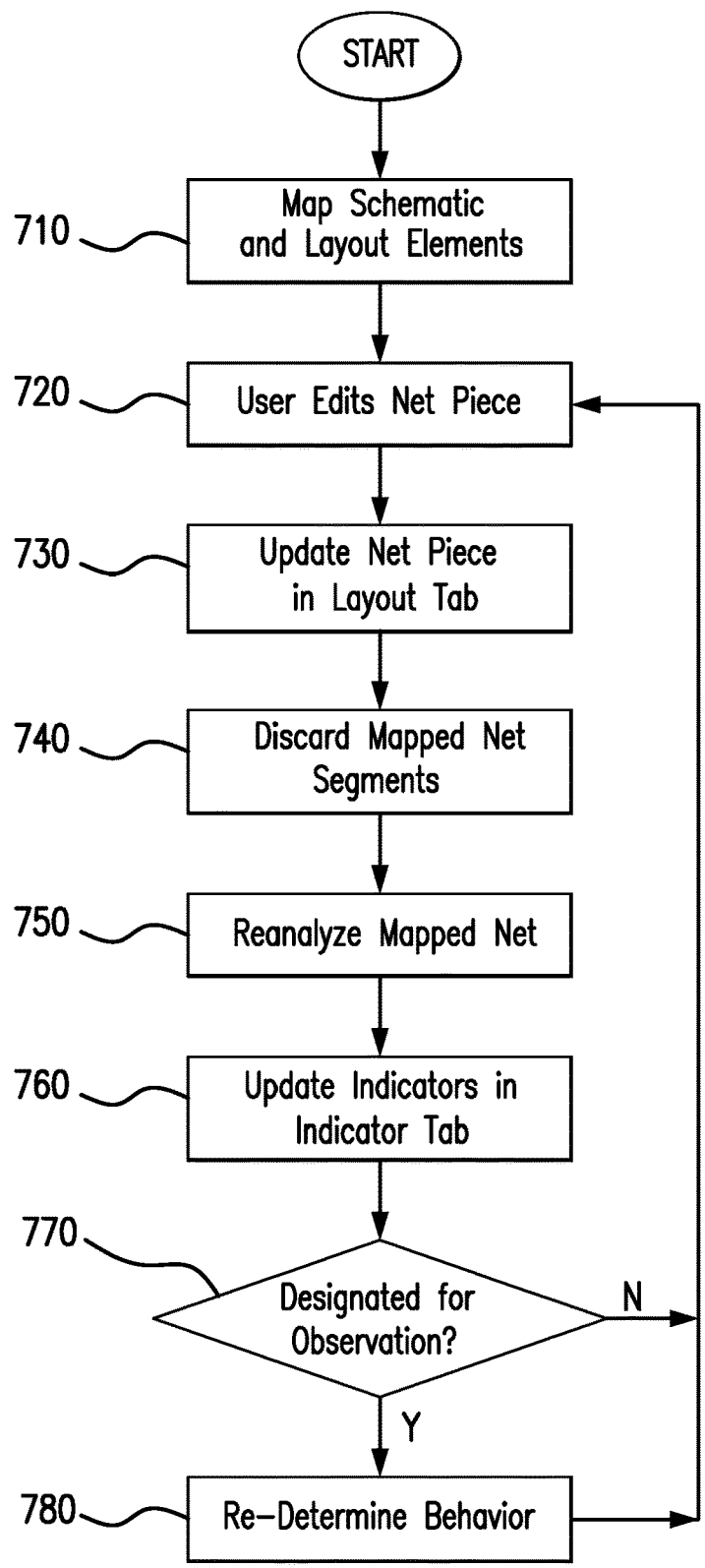
FIG. 7 is a block flowchart illustrating a method of maintaining correlation between tabs when a layout element is edited, in accordance with an exemplary embodiment of the present invention.

Preferably, correlation between the two tabs is maintained. This correlation preferably includes both the spatial mapping and the physical properties. FIG. 7 depicts a method for maintaining correlation between tabs when a layout element is edited, according to an exemplary embodiment of the invention.

In the depicted embodiment, at 710, the layout elements and schematic elements of the design are evaluated and associated in a mapping table. For nets, the layout elements are net pieces and the schematic elements are net segments, and both are associated with the net which is comprised of them. For electronic components, the mapping is a one-to-one correspondence, and in many embodiments this mapping for these components is unnecessary and omitted. Therefore, for brevity, it will be assumed going forward that only nets are being considered, but it will be appreciated by those of skill in the art that the principles described herein are applicable to other layout elements such as electronic components.

At 720, a net piece is edited through, for example, operation 550 of FIG. 5D. For convenience and brevity, the net containing the edited net piece will be referred to as "the edited net" going forward.

At 730, the edited net is updated in the layout tab to reflect the edits. This update preferably includes a rendering in the same manner as operation 470' of FIG. 4D, using the edited layout properties, but limited to the edited net, or net piece, rather than the entire circuit.

At 740, the net segments mapped to the edited net, and their schematic properties, are discarded. Net segments mapped to other nets are maintained without alteration. Then, at 750, the mapped net is reanalyzed and its schematic properties re-extracted without consideration for other layout elements. This reanalysis preferably includes delineation, physical property determination, and model construction in the same manner as operations 430, 440, and 450 of FIG. 4D, but limited to the edited net rather than the every net in the layout. Depending on the format of the circuit model, in some embodiments it is still necessary to reconstruct the circuit model for the entire design at the end of this operation, but the individual schematic element models used to construct this design model are preferably unaltered save for those representing segments of the edited net.

At 760, the edited net is updated in the indicator tab to reflect the edits. This update preferably includes a rendering of indicators in the same manner as operation 480' of FIG. 4D, using the re-extracted schematic properties, but limited to the segments of the edited net rather than the entire circuit.

As previously stated, it is preferable to be able to designate schematic elements for observation. Therefore, at 770, it is checked whether the edited net is designated for observation. Preferably, it is also checked whether the edited net influences the behavior of a designated schematic element. If either is true, the behavior of the designated element is re-determined at 780, preferably in the same manner as in operation 540 of FIG. 5D.

Finally, the method returns to 720 for another user edit.

Figure 8:
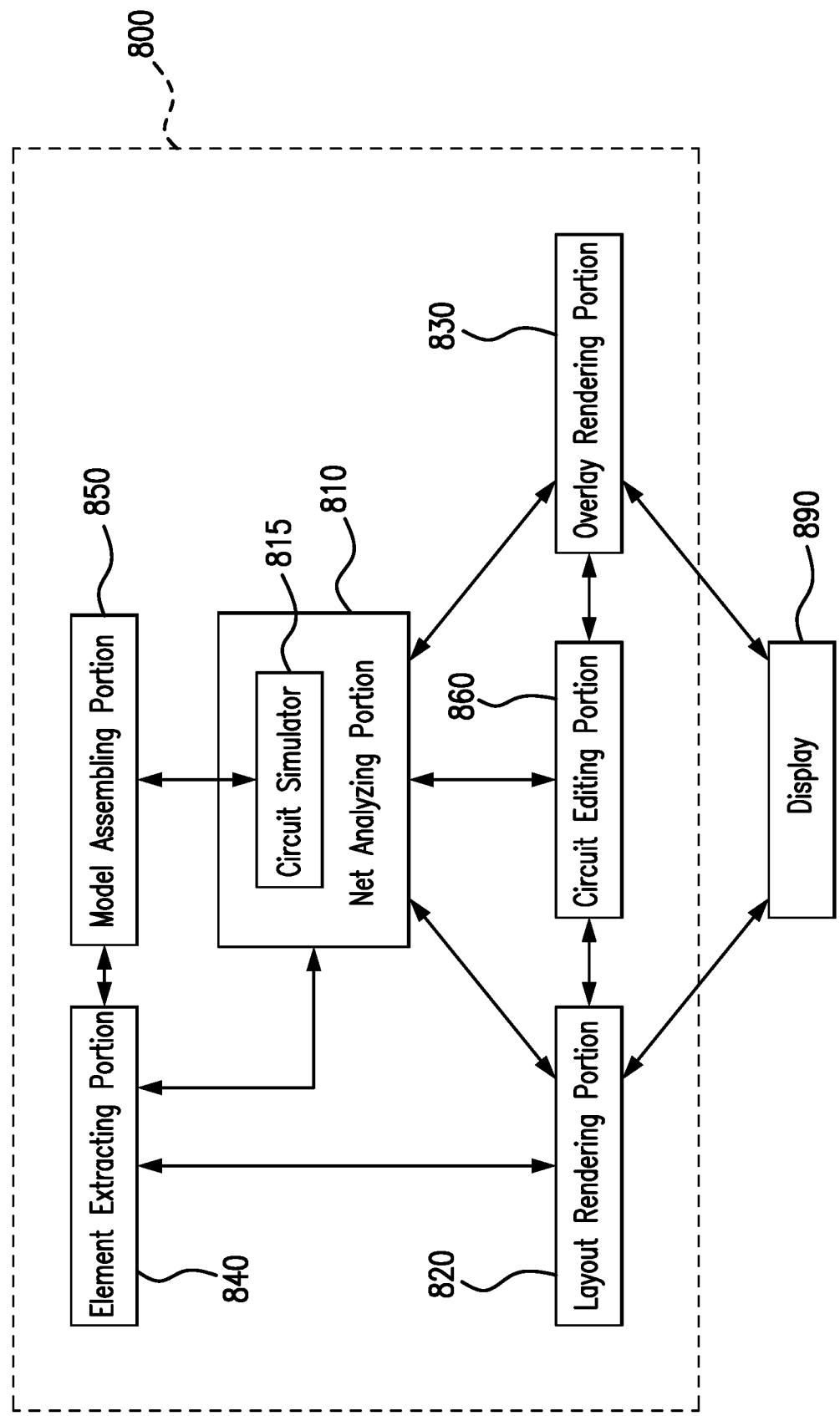
FIG. 8 is a block diagram illustrating a system for interactive circuit layout design, in accordance with an exemplary embodiment of the present invention.

FIG. 8 depicts a system for interactive circuit layout design, according to an exemplary embodiment of the invention. In the depicted embodiment, the system 800 is coupled to a display 890.

The system includes a net analyzing portion 410 which is executable to delineate net segments for the nets of a circuit layout, as, for example, in operation 430 of FIG. 4D. In certain embodiments, the net analyzing portion 410 is also executable to map net pieces to net segments, as, for example, in operation 460 of FIG. 4A, or alternatively in operation 710 of FIG. 7. In the depicted embodiment, the net analyzing portion 410 includes a simulator 815, which is executable to simulate a circuit model and thereby determine various schematic behaviors, as, for example, in operation 540 of FIG. 5D; in other embodiments, the simulator may be separate from the net analyzing portion 410.

The system includes a layout rendering portion 820, which is executable to render on the display 890 the physical layout of an electrical circuit product, as, for example, in operation 470' of FIG. 4D. The system includes an overlay rendering portion 830, which is executable to render on the display 890 segment indicators which are adaptively positioned as spatially mapped to their respective net segments, as, for example, in operation 470' of FIG. 4D.

The system includes an element extracting portion 840 which is executable to extract circuit elements from a provided layout, as, for example, in operation 420 of the method of FIG. 4D. In some embodiments, the element extracting portion 840 is also executable to determine physical properties of the circuit elements, as, for example, in operation 440 of the method of FIG. 4D. In other embodiments, net analyzing portion 410 makes this determination for at least the nets and their segments.

The system includes a model assembling portion 850 which is executable to construct a model of the circuit based on its extracted and delineated elements, as, for example, in operation 450 of the method of FIG. 4D. This model is then employed by the simulator 815 for simulation.

The system includes a circuit editing portion 860 which is executable to edit layout elements in the rendered layout, as, for example, in operation 550 of the method of FIG. 5D. The circuit editing portion 860 also processes other user input in various embodiments, which can include but is not limited to the designation of a schematic element for observation, or the alteration of schematic features.

These and related processes, and other necessary instructions, are preferably encoded as executable instructions on one or more non-transitory computer readable media, such as hard disc drives or optical discs, and executed using one or more computer processors, in concert with an operating system or other suitable measures.

In a software implementation, the software includes a plurality of computer executable instructions, to be implemented on a computer system. Prior to loading in a computer system, the software preferably resides as encoded information on a suitable non-transitory computer-readable tangible medium, such as a magnetic floppy disk, a magnetic tape, CD-ROM, or DVD-ROM.

In certain implementations, the invention includes a dedicated processor or processing portions of a system on chip (SOC), portions of a field programmable gate array (FPGA), or other such suitable measures, executing processor instructions for performing the functions described herein or emulating certain structures defined herein. Suitable circuits using, for example, discrete logic gates such as in an Application Specific Integrated Circuit (ASIC), Programmable Logic Array (PLA), or Field Programmable Gate Arrays (FPGA) are in certain embodiments also developed to perform these functions.

Figure 9:
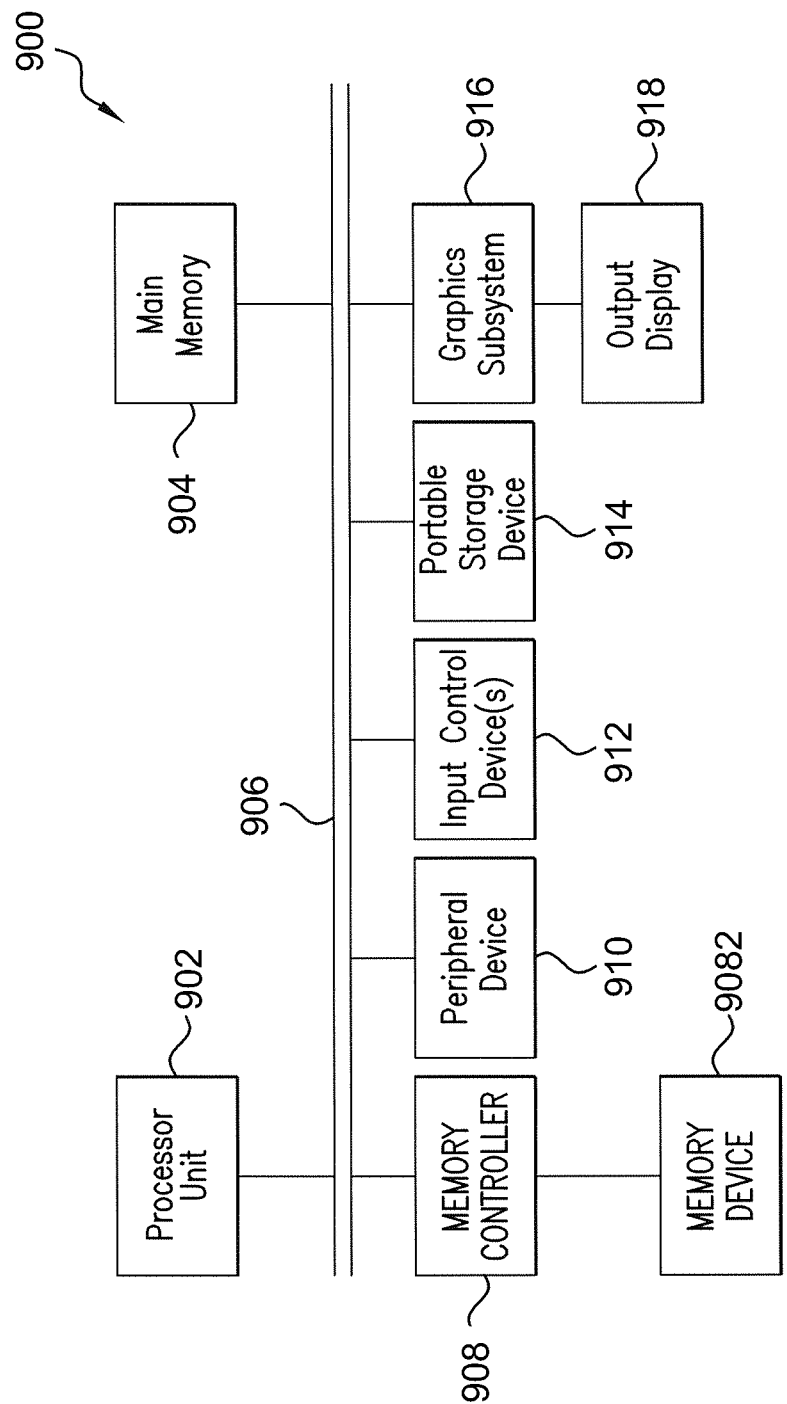
FIG. 9 is a block diagram illustrating an exemplary computer system for programmatic and/or hardware implementation of various embodiments and aspects of the present invention.

As an example implementation, FIG. 9 is a block diagram illustrating an exemplary computer system for programmatic and/or hardware implementation of various aspects of the disclosed system and method. For instance, it may serve as a host for such hardware modules, and/or as a host for executing software modules such as electronic design automation (EDA) tools/simulations/emulation/firmware, in accordance with various configurations of the disclosed system and method.

According to certain embodiments, computer system 900 includes a processor unit 902, a main memory 904, an interconnect bus 906, a memory controller 908 that is coupled to a memory device 9082, peripheral device(s) 910, input control device(s) 912, portable storage medium drive(s) 914, a graphics subsystem 916, and an output display 918. In various embodiments, processor unit 902 includes a single microprocessor or a plurality of microprocessors for configuring computer system 900 as a multi-processor system. Main memory 904 stores, in part, instructions and data to be executed by processor unit 902. Main memory 904 preferably includes banks of dynamic random access memory (DRAM) as well as high-speed cache memory.

For the purpose of simplicity, the components of computer system 900 are depicted to be interconnected via interconnect bus 906. However, in alternate embodiments, computer system 900 is interconnected through one or more data transport means. For example, in certain embodiments, processor unit 902 and main memory 904 are interconnected via a local microprocessor bus; and memory controller 908, peripheral device(s) 910, portable storage medium drive(s) 914, and graphics subsystem 916 are interconnected via one or more input/output (I/O) buses. Memory device 9082 is preferably implemented as a nonvolatile semiconductor memory for storing data and instructions to be used by processor unit 902. Memory device 9082 preferably stores the software to load it to the main memory 904, but in alternate embodiments is represented in an EDA tool simulation by suitable classes (incorporating data structures and functions operable upon the data structures) or the like as would be known to one of skill in the art.

Portable storage medium drive 914 operates to input and output data and code to and from the computer system 900. In one configuration, the software is stored on such a portable medium, and is input to computer system 900 via portable storage medium drive 914. In various embodiments, peripheral device(s) 910 includes any type of computer support device such as an input/output (I/O) interface, to add additional functionality to computer system 900. For example, in certain embodiments, peripheral device(s) 910 includes a network interface card, to interface computer system 900 to a network. In certain embodiments, peripheral device(s) also includes a memory controller and nonvolatile memory.

Input control device(s) 912 provide a portion of the user interface for a computer system 900 user. In various embodiments, input control device(s) 912 includes an alphanumeric keypad for inputting alphanumeric and other key information; and a cursor control device such as a mouse, a trackpad or stylus; or cursor direction keys.

In order to display textual and graphical information, computer system 900 includes graphics subsystem 914 and output display(s) 918. In various embodiments, output display 918 includes a cathode ray tube (CRT) display, liquid crystal display (LCD), plasma, or active matrix organic light emitting diode (AMOLED) display. Graphics subsystem 916 receives textual and graphical information, and processes the information for output to display 918.

The descriptions above are intended to illustrate possible implementations of the disclosed system and method, and are not restrictive. While this disclosure has been made in connection with specific forms and embodiments thereof, it will be appreciated that various modifications other than those discussed above may be resorted to without departing from the spirit or scope of the disclosed system and method. Such variations, modifications, and alternatives will become apparent to the skilled artisan upon a review of the disclosure. For example, functionally equivalent elements or method steps are substitutable for those specifically shown and described, and certain features are usable independently of other features. Additionally, in various embodiments, all or some of the above embodiments are selectively combined with each other, and particular locations of elements or sequence of method steps are reversed or interposed, all without departing from the spirit or scope of the disclosed system and method as defined in the appended claims. The scope should therefore be determined with reference to the description above and the appended claims, along with their full range of equivalents.

What is claimed is:

1. A system for an interactive circuit layout design having spatially adaptive overlay indicative of parametric properties thereof, the system comprising:

a layout rendering portion executable to graphically render on a display a physical layout of an electrical circuit product to be manufactured, the physical layout including a plurality of nets routed to interconnect electronic components of the electrical circuit product;

a net analyzing portion coupled to said layout rendering portion, said net analyzing portion being executable to delineate a plurality of net segments for at least one net of the plurality of nets of the physical layout, each net segment of the plurality of net segments having at least one physical property parametrically specified in a value therefor; and an overlay rendering portion coupled to said net analyzing portion, said overlay rendering portion being executable to selectively render on the display a plurality of segment indicators respectively corresponding to the net segments, each segment indicator of the plurality of segment indicators being adaptively positioned on the display spatially mapped to a net segment of the plurality of segments corresponding thereto as a symbolic surrogate for the corresponding net segment within the physical layout, wherein said net analyzing portion executes upon selection of a segment indicator of the plurality of segment indicators to determine a behavior of the electrical circuit product during an operation consistent with an electrical response of the corresponding net segment in accordance with the specified physical property thereof.

2. The system of claim 1, further comprising a model assembling portion coupled to the net analyzing portion, said model assembling portion executable to construct a simulation model of at least a portion of the electrical circuit product, the simulation model including at least one net model configured to represent one net segment of the plurality of net segments, wherein the net analyzing portion determines the behavior of the electrical circuit product based on a circuit simulation of the simulation model.

3. The system of claim 2, wherein the circuit simulation executes upon selection of a segment indicator to exclusively simulate nets and electronic components of the electrical circuit product which influence a circuit behavior within the corresponding net segment.

4. The system of claim 1, wherein the at least one physical property of each net segment includes at least one resistance value.

5. The system of claim 1, wherein each segment indicator is spatially mapped at a center of the corresponding net segment.

6. The system of claim 1, wherein each segment indicator is spatially mapped at an edge of the corresponding net segment.

7. The system of claim 1, wherein the determined behavior of the electrical circuit product includes a current waveform at a predetermined point within the net segment corresponding to the selected net segment indicator.

8. The system of claim 1, wherein the determined behavior of the electrical circuit product includes a voltage waveform at a predetermined point within the net segment corresponding to the selected net segment indicator.

9. The system of claim 1, wherein the determined behavior of the electrical circuit product includes a signal timing at a predetermined point within the net segment corresponding to the selected net segment indicator.

10. The system of claim 1, further comprising a circuit editing portion coupled to the layout rendering portion, said circuit editing portion executable to edit at least one net of the physical layout, wherein the layout rendering portion executes to re-render the edited net responsive to an editing of the circuit editor, wherein, responsive to the editing of the circuit editor, the net analyzing portion delineates a plurality of updated net segments for the edited net exclusive of other nets of the physical layout, and wherein the overlay rendering portion executes to selectively render updated segment indicators corresponding to each updated net segment of the edited net responsive to the editing of the circuit editor, to thereby maintain spatial mapping.

11. A method of an interactive circuit layout design having spatially adaptive overlay indicative of parametric properties thereof, the method comprising:

graphically rendering on a display a physical layout of an electrical circuit product to be manufactured, the physical layout including a plurality of nets routed to interconnect electronic components of the electrical circuit product;

delineating a plurality of net segments for at least one net of the plurality of nets of the physical layout, each segment indicator of a net segment of the plurality of net segments having at least one physical property parametrically specified in a value therefor;

selectively rendering on the display a plurality of segment indicators respectively corresponding to the plurality of net segments, each segment indicator of the plurality of segment indicators being adaptively positioned on the display spatially mapped to a net segment of the plurality of net segments corresponding thereto as a symbolic surrogate for the corresponding net segment within the physical layout;

selecting one segment indicator of the plurality of segment indicators; and determining a behavior of the electrical circuit product during an operation consistent with an electrical response of the corresponding net segment in accordance with the specified physical property thereof.

12. The method of claim 11, further comprising constructing a simulation model of at least a portion of the electrical circuit product, the simulation model including at least one net model configured to represent one net segment of the plurality of net segments, wherein the behavior of the electrical circuit product is determined based on a circuit simulation of the simulation model.

13. The method of claim 12, wherein the circuit simulation executes upon selection of a segment indicator to exclusively simulate nets and electronic components of the electrical circuit product which influence a circuit behavior within the corresponding net segment.

14. The method of claim 11, wherein the at least one physical property of each net segment includes at least one resistance value.

15. The method of claim 11, wherein the determined behavior of the electrical circuit product includes a voltage waveform at a predetermined point within the net segment corresponding to the selected segment indicator.

16. The method of claim 11, wherein the determined behavior of the electrical circuit product includes a signal timing at a predetermined point within the net segment corresponding to the selected segment indicator.

17. The method of claim 11, further comprising, responsive to an editing of at least one net of the physical layout:

re-rendering the edited net on the display;

delineating a plurality of updated net segments for the edited net exclusive of other nets of the physical layout;

re-determining the specified physical property of each updated net segment of the edited net exclusive of the other nets of the physical layout; and selectively rendering on the display updated segment indicators respectively corresponding to the updated net segments, to thereby maintain spatial mapping.

18. A method of an interactive circuit layout design having spatially adaptive overlay indicative of parametric properties thereof, the method comprising:

graphically rendering on a display a physical layout of an electrical circuit product to be manufactured, the physical layout including a plurality of nets routed to interconnect electronic components of the electrical circuit product, a plurality of net segments delineated for and mapped to at least one net of the plurality of nets of the physical layout;

responsive to an editing of the at least one net of the physical layout, re-rendering the edited net on the display;

responsive to the editing of the at least one net of the physical layout, delineating a plurality of updated net segments for the edited net, exclusive of other nets of the physical layout;

responsive to the delineating the plurality of updated net segments, determining a specified physical property of each updated net segment of the edited net, exclusive of other nets of the physical layout; and responsive to the delineating the plurality of updated net segments, selectively rendering on the display a plurality of updated segment indicators respectively corresponding to the plurality of updated net segments, each updated segment indicator of the updated segment indicators being adaptively positioned on the display spatially mapped to a net segment of the plurality of net segments corresponding thereto as a symbolic surrogate for the corresponding net segment within the physical layout.

19. The method of claim 18, wherein the specified physical property of each updated net segment includes at least one resistance value.

20. The method of claim 18, further comprising:

constructing a simulation model of at least a portion of the electrical circuit product, the simulation model including at least one net model configured to represent one updated net segment of the updated net segments, and determining a behavior of the electrical circuit product during an operation consistent with an electrical response of the corresponding net segment, the behavior being determined based on a circuit simulation of the simulation model.

* * * * *